United States Patent
Xie et al.

(10) Patent No.: US 9,711,703 B2
(45) Date of Patent: Jul. 18, 2017

(54) APPARATUS, SYSTEM AND METHOD FOR USE IN MOUNTING ELECTRONIC ELEMENTS

(75) Inventors: Jian-Hui Xie, Guangdong (CN); Chi Wing Leung, Hong Kong (CN); Xuan Wang, Guangdong (CN)

(73) Assignee: CREE HUIZHOU OPTO LIMITED, Huizhou Municipality, Guangdong Province (CN)

( * ) Notice: Subject to any disclaimer, the term of this patent is extended or adjusted under 35 U.S.C. 154(b) by 27 days.

(21) Appl. No.: 12/069,827

(22) Filed: Feb. 12, 2008

(65) Prior Publication Data
US 2008/0218973 A1   Sep. 11, 2008

Related U.S. Application Data

(60) Provisional application No. 60/889,532, filed on Feb. 12, 2007.

(51) Int. Cl.
*H01L 33/64*   (2010.01)
*F21V 29/70*   (2015.01)
(Continued)

(52) U.S. Cl.
CPC ............ *H01L 33/644* (2013.01); *F21V 29/70* (2015.01); *H01L 23/057* (2013.01);
(Continued)

(58) Field of Classification Search
USPC .......... 361/679.54, 704, 707, 709, 710, 712, 361/715, 717; 165/80.2, 185; 174/252;
(Continued)

(56) References Cited

U.S. PATENT DOCUMENTS

| 1,581,527 A | 4/1926 | Yingling |
|---|---|---|
| 1,591,924 A | 7/1926 | Lopsinger |

(Continued)

FOREIGN PATENT DOCUMENTS

| CN | 2498694 | 7/2002 |
|---|---|---|
| CN | 2549313 | 5/2003 |

(Continued)

OTHER PUBLICATIONS

Official Notice of Decision for Refusal regarding related Japanese Design Application No. 2009-002857, dated Nov. 17, 2009.
(Continued)

*Primary Examiner* — Zachary M Pape
(74) *Attorney, Agent, or Firm* — Koppel, Patrick, Heybl & Philpott

(57) ABSTRACT

The present invention provides various embodiments for apparatuses, systems, and methods of manufacturing surface mountable devices. Some embodiments provide surface mount devices comprising a casing with a first and second surface and at least one side surface. A recess is formed in the first surface and extends into the casing. plurality of leads is partially encased by the casing, and one or more electronic devices are coupled with at least one of the plurality of leads and are at least partially exposed through the recess. A heat sink may be included for heat dissipation.

36 Claims, 10 Drawing Sheets

(51) Int. Cl.
*H01L 23/057* (2006.01)
*H05K 7/20* (2006.01)
*F21V 29/507* (2015.01)
*F21V 29/503* (2015.01)

(52) U.S. Cl.
CPC ........... *F21V 29/503* (2015.01); *F21V 29/507* (2015.01); *H01L 33/642* (2013.01); *H01L 2224/32245* (2013.01); *H05K 7/2039* (2013.01)

(58) Field of Classification Search
USPC ............. 257/713, 718, 719, 721, 98, 79, 81, 257/E33.062; 362/373, 382; 438/26, 438/112, 122
See application file for complete search history.

(56) References Cited

U.S. PATENT DOCUMENTS

| | | |
|---|---|---|
| 1,679,168 A | 7/1928 | O'Brien |
| 3,760,237 A | 9/1973 | Jaffe ................................ 257/98 |
| 4,307,297 A | 12/1981 | Groff |
| 4,322,735 A | 3/1982 | Sadamasa et al. |
| 4,511,425 A | 4/1985 | Boyd ............................ 156/493 |
| 5,040,868 A | 8/1991 | Waitl |
| 5,042,048 A * | 8/1991 | Meyer ........................... 372/108 |
| 5,122,943 A | 6/1992 | Pugh ............................ 362/256 |
| 5,130,761 A | 7/1992 | Tanaka ........................... 357/17 |
| 5,167,556 A | 12/1992 | Stein |
| 5,351,106 A | 9/1994 | Lesko ............................. 355/83 |
| 5,703,401 A | 12/1997 | Van De Water |
| 5,706,177 A | 1/1998 | Nather |
| 5,790,298 A | 8/1998 | Tonar ............................. 359/267 |
| 5,813,753 A | 9/1998 | Vriens et al. .................. 362/293 |
| 5,907,151 A | 5/1999 | Gramann |
| 5,942,770 A | 8/1999 | Ishinaga et al. ................ 257/89 |
| 5,959,316 A | 9/1999 | Lowery .......................... 257/98 |
| 6,061,160 A | 5/2000 | Maruyama ..................... 359/152 |
| 6,066,861 A | 5/2000 | Hohn et al. |
| 6,183,100 B1 | 2/2001 | Suckow et al. ................ 362/35 |
| 6,224,216 B1 | 5/2001 | Parker et al. .................. 353/31 |
| 6,230,789 B1* | 5/2001 | Pei et al. ..................... 165/80.3 |
| 6,259,608 B1 | 7/2001 | Berardinelli et al. |
| 6,274,924 B1* | 8/2001 | Carey et al. .................. 257/676 |
| 6,296,367 B1 | 10/2001 | Parsons et al. ............... 362/183 |
| 6,345,903 B1 | 2/2002 | Koike .................. 257/E33.059 |
| 6,359,236 B1 | 3/2002 | DiStefano et al. |
| 6,376,902 B1 | 4/2002 | Arndt ............................. 257/100 |
| 6,392,294 B1 | 5/2002 | Yamaguchi |
| 6,447,124 B1 | 9/2002 | Fletcher et al. ............... 359/604 |
| 6,454,437 B1 | 9/2002 | Kelly ............................. 362/246 |
| 6,469,321 B2 | 10/2002 | Arndt |
| 6,480,389 B1* | 11/2002 | Shie et al. ..................... 361/707 |
| 6,517,218 B2* | 2/2003 | Hochstein ..................... 362/294 |
| 6,536,913 B1 | 3/2003 | Yajima et al. ................. 362/231 |
| 6,573,580 B2 | 6/2003 | Arndt |
| 6,610,563 B1 | 8/2003 | Waitl |
| 6,614,058 B2 | 9/2003 | Lin et al. |
| 6,621,210 B2 | 9/2003 | Kato et al. .................... 313/496 |
| 6,624,491 B2 | 9/2003 | Waitl et al. |
| 6,680,490 B2 | 1/2004 | Yasukawa et al. |
| 6,686,609 B1 | 2/2004 | Sung |
| 6,700,136 B2 | 3/2004 | Guida ............................. 257/79 |
| 6,707,069 B2 | 3/2004 | Song et al. ..................... 257/79 |
| 6,710,373 B2 | 3/2004 | Wang |
| 6,717,353 B1 | 4/2004 | Mueller et al. ............... 313/501 |
| 6,759,733 B2 | 7/2004 | Arndt ............................. 257/672 |
| 6,765,235 B2 | 7/2004 | Taninaka et al. ............... 257/88 |
| 6,770,498 B2 | 8/2004 | Hsu ................................ 438/26 |
| 6,774,401 B2 | 8/2004 | Nakada et al. |
| 6,791,259 B1 | 9/2004 | Stokes |
| 6,858,879 B2* | 2/2005 | Waitl et al. .................... 257/99 |
| 6,872,585 B2 | 3/2005 | Matsumura et al. |
| 6,876,149 B2 | 4/2005 | Miyashita |
| 6,900,511 B2 | 5/2005 | Ruhnau et al. |
| 6,911,678 B2 | 6/2005 | Fujisawa et al. |
| 6,914,268 B2 | 7/2005 | Shei ................................ 257/99 |
| 6,919,586 B2 | 7/2005 | Fujii |
| 6,940,704 B2 | 9/2005 | Stalions |
| 6,946,714 B2 | 9/2005 | Waitl |
| 6,964,877 B2 | 11/2005 | Chen et al. ..................... 438/20 |
| 6,975,011 B2 | 12/2005 | Arndt |
| 6,995,510 B2 | 2/2006 | Murakami |
| D517,025 S | 3/2006 | Asakawa ..................... D13/180 |
| 7,009,627 B2 | 3/2006 | Abe et al. ..................... 345/690 |
| 7,021,797 B2 | 4/2006 | Minano et al. ............... 362/355 |
| 7,064,907 B2 | 6/2006 | Kaneko |
| 7,066,626 B2 | 6/2006 | Omata .......................... 362/257 |
| 7,102,213 B2 | 9/2006 | Sorg |
| 7,119,422 B2* | 10/2006 | Chin .............................. 257/666 |
| 7,161,189 B2* | 1/2007 | Wu ................................ 257/98 |
| 7,187,009 B2 | 3/2007 | Fukasawa et al. ............. 257/98 |
| 7,224,000 B2 | 5/2007 | Aanegola et al. |
| 7,244,965 B2 | 7/2007 | Andrews et al. |
| 7,282,740 B2 | 10/2007 | Chikugawa et al. ........... 257/79 |
| 7,285,802 B2 | 10/2007 | Ouderkirk et al. ............. 257/98 |
| 7,303,315 B2 | 12/2007 | Ouderkirk et al. ........... 362/294 |
| D572,210 S | 7/2008 | Lee .............................. D13/180 |
| D572,670 S | 7/2008 | Ono et al. .................... D13/180 |
| D576,574 S | 9/2008 | Kobayakawa .............. D13/180 |
| 7,429,757 B2 | 9/2008 | Oyama et al. ................ 257/675 |
| 7,579,628 B2 | 8/2009 | Inoguchi ....................... 257/81 |
| 7,622,795 B2 | 11/2009 | Chiang ......................... 257/675 |
| 7,635,915 B2 | 12/2009 | Xie et al. ...................... 257/692 |
| 7,692,206 B2 | 4/2010 | Loh ................................ 257/99 |
| 7,777,412 B2 | 8/2010 | Pang ............................ 313/506 |
| 7,875,899 B2 | 1/2011 | Yasuda ........................... 257/99 |
| 7,923,831 B2 | 4/2011 | Ng ................................. 257/692 |
| 8,217,414 B2 | 7/2012 | Hayashi ......................... 257/99 |
| 2002/0021085 A1 | 2/2002 | Ng |
| 2002/0030194 A1 | 3/2002 | Camras et al. |
| 2002/0061174 A1 | 5/2002 | Hurt et al. |
| 2002/0066905 A1 | 6/2002 | Wang |
| 2002/0123163 A1 | 9/2002 | Fujii |
| 2002/0163001 A1 | 11/2002 | Shaddock |
| 2002/0171087 A1 | 11/2002 | Krames et al. |
| 2002/0171911 A1 | 11/2002 | Maegawa |
| 2002/0195935 A1 | 12/2002 | Jager |
| 2003/0116769 A1 | 6/2003 | Song et al. |
| 2003/0121511 A1 | 7/2003 | Hashimura et al. |
| 2003/0160256 A1 | 8/2003 | Durocher et al. ............... 257/88 |
| 2003/0183852 A1 | 10/2003 | Takenaka |
| 2004/0016938 A1 | 1/2004 | Baretz et al. ................. 257/100 |
| 2004/0037076 A1 | 2/2004 | Katoh et al. .................. 362/235 |
| 2004/0041222 A1 | 3/2004 | Loh |
| 2004/0047151 A1 | 3/2004 | Bogner et al. |
| 2004/0079957 A1 | 4/2004 | Andrews et al. |
| 2004/0080939 A1 | 4/2004 | Braddell et al. |
| 2004/0090174 A1 | 5/2004 | Tasch et al. |
| 2004/0126913 A1 | 7/2004 | Loh |
| 2004/0207999 A1 | 10/2004 | Suehiro et al. ................ 362/84 |
| 2004/0217364 A1 | 11/2004 | Tarsa |
| 2004/0227149 A1 | 11/2004 | Ibbetson |
| 2004/0232435 A1 | 11/2004 | Hofer |
| 2004/0238930 A1 | 12/2004 | Arndt ............................. 257/678 |
| 2005/0023548 A1 | 2/2005 | Bhat |
| 2005/0072981 A1* | 4/2005 | Suenaga ........................ 257/88 |
| 2005/0077535 A1 | 4/2005 | Li |
| 2005/0082574 A1 | 4/2005 | Tasch et al. |
| 2005/0093005 A1 | 5/2005 | Ruhnau |
| 2005/0110033 A1 | 5/2005 | Heremans et al. ............. 257/98 |
| 2005/0117320 A1 | 6/2005 | Leu et al. |
| 2005/0127377 A1 | 6/2005 | Arndt |
| 2005/0135105 A1* | 6/2005 | Teixeira et al. ............... 362/294 |
| 2005/0152127 A1 | 7/2005 | Kamiya et al. |
| 2005/0156187 A1 | 7/2005 | Isokawa |
| 2005/0179041 A1 | 8/2005 | Harbers et al. |
| 2005/0179376 A1 | 8/2005 | Fung et al. |
| 2005/0199899 A1 | 9/2005 | Lin et al. |
| 2005/0231983 A1 | 10/2005 | Dahm ........................... 362/800 |
| 2005/0253130 A1 | 11/2005 | Tsutsumi et al. ............... 257/13 |
| 2006/0022212 A1 | 2/2006 | Waitl |
| 2006/0049477 A1 | 3/2006 | Arndt |

(56) References Cited

U.S. PATENT DOCUMENTS

| | | |
|---|---|---|
| 2006/0054912 A1 | 3/2006 | Murakami et al. |
| 2006/0060867 A1 | 3/2006 | Suehirom ................ 257/81 |
| 2006/0091406 A1 | 5/2006 | Kaneko ................ 257/81 |
| 2006/0102917 A1 | 5/2006 | Oyama ................ 257/99 |
| 2006/0105478 A1 | 5/2006 | Camras et al. |
| 2006/0105485 A1 | 5/2006 | Basin ................ 438/27 |
| 2006/0108594 A1 | 5/2006 | Iwasaki et al. |
| 2006/0131591 A1 | 6/2006 | Sumitani |
| 2006/0133044 A1* | 6/2006 | Kim et al. ................ 361/704 |
| 2006/0151809 A1 | 7/2006 | Isokawa |
| 2006/0157828 A1 | 7/2006 | Sorg |
| 2006/0180925 A1* | 8/2006 | Lee ................ H01L 33/486 257/717 |
| 2006/0220046 A1 | 10/2006 | Yu et al. |
| 2006/0267031 A1 | 11/2006 | Tasch et al. |
| 2006/0267042 A1 | 11/2006 | Izuno et al. |
| 2006/0278882 A1 | 12/2006 | Leung et al. ................ 257/98 |
| 2006/0284207 A1 | 12/2006 | Park ................ 257/99 |
| 2006/0291185 A1 | 12/2006 | Atsushi ................ 362/29 |
| 2007/0046176 A1 | 3/2007 | Bukesov et al. |
| 2007/0096139 A1 | 5/2007 | Schultz |
| 2007/0109779 A1 | 5/2007 | Sekiguchi et al. |
| 2007/0145401 A1 | 6/2007 | Ikehara |
| 2007/0170449 A1 | 7/2007 | Anandan |
| 2007/0221928 A1 | 9/2007 | Lee ................ 257/79 |
| 2007/0241357 A1 | 10/2007 | Yan ................ 257/98 |
| 2007/0262328 A1 | 11/2007 | Bando |
| 2007/0269586 A1 | 11/2007 | Leatherdale |
| 2007/0294975 A1 | 12/2007 | Nadar et al. ................ 52/483 |
| 2007/0295975 A1 | 12/2007 | Omae ................ 257/89 |
| 2008/0013319 A1* | 1/2008 | Pei ................ H01L 33/486 362/294 |
| 2008/0026498 A1 | 1/2008 | Tarsa et al. ................ 438/26 |
| 2008/0041625 A1 | 2/2008 | Cheong ................ 174/521 |
| 2008/0072251 A1 | 3/2008 | Namvar |
| 2008/0074032 A1 | 3/2008 | Yano et al. ................ 313/503 |
| 2008/0093606 A1 | 4/2008 | Pan et al. |
| 2008/0121921 A1 | 5/2008 | Loh et al. |
| 2008/0149960 A1 | 6/2008 | Amo ................ 257/98 |
| 2008/0170391 A1 | 7/2008 | Norfidathul ................ 362/227 |
| 2008/0186702 A1 | 8/2008 | Camras et al. |
| 2008/0191232 A1* | 8/2008 | Lee et al. ................ 257/98 |
| 2008/0191610 A1 | 8/2008 | Oshio |
| 2008/0198594 A1 | 8/2008 | Lee |
| 2008/0230790 A1 | 9/2008 | Seko et al. |
| 2008/0258156 A1 | 10/2008 | Hata ................ 257/88 |
| 2008/0296590 A1 | 12/2008 | Ng ................ 257/88 |
| 2008/0303052 A1* | 12/2008 | Lee et al. ................ 257/99 |
| 2008/0308825 A1 | 12/2008 | Chakraborty |
| 2009/0050908 A1 | 2/2009 | Yuan et al. |
| 2009/0050911 A1 | 2/2009 | Chakraborty |
| 2009/0057699 A1 | 3/2009 | Basin |
| 2009/0057708 A1 | 3/2009 | Karim et al. |
| 2009/0072251 A1 | 3/2009 | Chan et al. |
| 2009/0095966 A1 | 4/2009 | Keller et al. ................ 257/98 |
| 2009/0129085 A1 | 5/2009 | Aizar ................ 362/247 |
| 2009/0189178 A1* | 7/2009 | Kim et al. ................ 257/99 |
| 2009/0283781 A1 | 11/2009 | Chan et al. |
| 2010/0044735 A1 | 2/2010 | Oyamada ................ 257/98 |
| 2010/0103660 A1 | 4/2010 | Van de Ven et al. ........ 362/231 |
| 2010/0193822 A1 | 8/2010 | Inobe et al. ................ 257/98 |
| 2011/0049545 A1 | 3/2011 | Basin et al. ................ 257/98 |
| 2011/0108874 A1 | 5/2011 | Chu ................ 257/98 |
| 2011/0121345 A1 | 5/2011 | Andrews et al. |
| 2011/0186880 A1 | 8/2011 | Kohler et al. ................ 257/91 |
| 2011/0193118 A1 | 8/2011 | Oshima et al. |
| 2011/0278617 A1 | 11/2011 | Lee |
| 2012/0235199 A1 | 9/2012 | Andrews et al. |
| 2012/0257386 A1 | 10/2012 | Harbers et al. ................ 362/235 |
| 2012/0268957 A1 | 10/2012 | Premysler ................ 362/455 |
| 2013/0056774 A1 | 3/2013 | Hong et al. ................ 257/98 |
| 2013/0063024 A1 | 3/2013 | Wada ................ 313/512 |
| 2013/0337591 A1 | 12/2013 | Chen ................ 438/27 |
| 2014/0034986 A1 | 2/2014 | Bradley ................ 257/98 |
| 2015/0137162 A1 | 5/2015 | Sabathil ................ 257/98 |

FOREIGN PATENT DOCUMENTS

| | | |
|---|---|---|
| CN | 2617039 Y | 5/2004 |
| CN | 2646873 | 10/2004 |
| CN | 1977399 A | 6/2007 |
| CN | 101013689 | 8/2007 |
| CN | 101360368 | 2/2009 |
| CN | 101360368 | 4/2009 |
| CN | 101611502 A | 12/2009 |
| DE | WO 9931737 | 6/1999 |
| DE | 202007012162 | 4/2008 |
| EP | 0684648 | 11/1995 |
| EP | 1005085 A2 | 5/2000 |
| EP | 1187228 | 3/2002 |
| EP | 1 418 630 A1 | 5/2004 |
| EP | 1521313 | 4/2005 |
| EP | 1 538 680 A2 | 6/2005 |
| EP | 1653254 A2 | 5/2006 |
| EP | 1693904 | 8/2006 |
| EP | 1864780 | 12/2007 |
| EP | 1 953 834 A1 | 8/2008 |
| GB | 2420221 A | 11/2004 |
| GB | 2420221 A * | 5/2006 |
| GB | 2 458 972 A | 10/2009 |
| GB | 2466633 | 7/2010 |
| GB | 2466633 A | 7/2010 |
| JP | 53-118019 | 10/1978 |
| JP | S 53126570 | 10/1978 |
| JP | 59-027559 A | 2/1984 |
| JP | 59027559 | 2/1984 |
| JP | 61-048951 A | 3/1986 |
| JP | 61048951 | 3/1986 |
| JP | S 62160564 | 3/1986 |
| JP | 61048951 | 10/1986 |
| JP | 62047156 | 2/1987 |
| JP | 62140758 | 9/1987 |
| JP | 038459 | 1/1991 |
| JP | 03-171780 | 7/1991 |
| JP | 06-177424 | 6/1994 |
| JP | 7-202271 A | 8/1995 |
| JP | 07202271 | 8/1995 |
| JP | 07231120 | 8/1995 |
| JP | 08032120 | 2/1996 |
| JP | 61048951 | 3/1996 |
| JP | 10135492 | 5/1998 |
| JP | 10321909 | 12/1998 |
| JP | 11008405 | 1/1999 |
| JP | 11-054802 | 2/1999 |
| JP | 11054802 | 2/1999 |
| JP | 11150306 | 6/1999 |
| JP | 11261113 | 9/1999 |
| JP | 2000-188358 | 7/2000 |
| JP | 2000-223751 | 8/2000 |
| JP | 2000223751 | 8/2000 |
| JP | 2000261041 | 9/2000 |
| JP | 2001044506 | 2/2001 |
| JP | 2001-168400 | 6/2001 |
| JP | 2001237463 | 8/2001 |
| JP | 2001518692 | 10/2001 |
| JP | 2002009217 | 1/2002 |
| JP | 2002-223005 | 8/2002 |
| JP | 2002280479 A | 9/2002 |
| JP | 2002374005 | 12/2002 |
| JP | 2003007946 A | 1/2003 |
| JP | 2003-197974 | 7/2003 |
| JP | 2003218405 | 7/2003 |
| JP | 2003-264267 | 9/2003 |
| JP | 2003318449 | 11/2003 |
| JP | 2003324214 | 11/2003 |
| JP | 2004022862 | 1/2004 |
| JP | 2004056075 | 2/2004 |
| JP | 2004103775 | 2/2004 |
| JP | 2004507114 | 3/2004 |
| JP | 2004-111937 A | 4/2004 |
| JP | 2004146815 | 5/2004 |
| JP | 2004-200236 | 7/2004 |
| JP | 2004200236 | 7/2004 |
| JP | 2004228387 | 8/2004 |
| JP | 2004327955 | 11/2004 |

(56) References Cited

FOREIGN PATENT DOCUMENTS

| | | |
|---|---|---|
| JP | 2004335740 | 11/2004 |
| JP | 2004335880 | 11/2004 |
| JP | 2004342870 | 12/2004 |
| JP | 2005-019838 A | 1/2005 |
| JP | 2005019838 | 1/2005 |
| JP | 2005045199 | 2/2005 |
| JP | 2005-079167 | 3/2005 |
| JP | 2005151624 | 6/2005 |
| JP | 2005223222 | 8/2005 |
| JP | 2005259754 | 9/2005 |
| JP | 2005259972 | 9/2005 |
| JP | 2005-310935 | 11/2005 |
| JP | 2005347401 | 12/2005 |
| JP | 2005539386 | 12/2005 |
| JP | 2006019557 | 1/2006 |
| JP | 2006508537 | 3/2006 |
| JP | 2006509372 A | 3/2006 |
| JP | 2006108517 | 4/2006 |
| JP | 2006-119357 | 5/2006 |
| JP | 2006179520 | 7/2006 |
| JP | 2006253689 | 9/2006 |
| JP | 2006-324331 | 11/2006 |
| JP | 2006324589 | 11/2006 |
| JP | 2006525679 | 11/2006 |
| JP | 2006332234 | 12/2006 |
| JP | 2006344692 | 12/2006 |
| JP | 2007-094088 | 4/2007 |
| JP | 2007109836 | 4/2007 |
| JP | 2007509505 | 4/2007 |
| JP | 2007-165029 | 6/2007 |
| JP | 2007165840 | 6/2007 |
| JP | 2007184542 | 7/2007 |
| JP | 2007243226 | 9/2007 |
| JP | 2007-273763 | 10/2007 |
| JP | 6148951 | 10/2007 |
| JP | 2007273763 | 10/2007 |
| JP | 2007281323 | 10/2007 |
| JP | 2007-287981 | 11/2007 |
| JP | 2007-299905 | 11/2007 |
| JP | 2007317896 | 12/2007 |
| JP | 2007329516 | 12/2007 |
| JP | 2008518461 | 5/2008 |
| JP | 2008521236 | 6/2008 |
| JP | H1054802 | 3/2011 |
| RU | 2251761 | 2/2005 |
| TW | 200616246 A | 5/2006 |
| WO | WO 0217405 | 2/2002 |
| WO | WO 03049204 | 6/2003 |
| WO | WO 2004003660 | 4/2004 |
| WO | WO 2004036660 | 4/2004 |
| WO | WO 2004036660 A1 | 4/2004 |
| WO | WO 2004044877 | 5/2004 |
| WO | WO 2004/053933 A2 | 6/2004 |
| WO | WO 2004/107461 * 12/2004 | ............. H01L 33/00 |
| WO | WO 2005043627 A1 | 5/2005 |
| WO | WO 2005104247 | 11/2005 |
| WO | WO 2006016398 | 2/2006 |
| WO | WO 2006046981 | 5/2006 |
| WO | WO 2006054228 | 5/2006 |
| WO | WO 2006054228 A2 | 5/2006 |
| WO | WO 2006054228 A3 | 5/2006 |
| WO | WO 2006054228 | 6/2006 |
| WO | WO 2006135502 | 12/2006 |
| WO | WO 2007/083408 A1 | 7/2007 |
| WO | WO 2007121486 A2 | 10/2007 |
| WO | WO2007/127929 A2 | 11/2007 |
| WO | WO 2007122516 | 11/2007 |
| WO | WO 2008081794 A1 | 7/2008 |
| WO | WO 2008082098 | 7/2008 |
| WO | WO 2008082098 | 10/2008 |
| WO | WO 2009/074919 A1 | 6/2009 |
| WO | WO 2010005294 | 1/2010 |
| WO | WO 2012099145 A1 | 7/2012 |

OTHER PUBLICATIONS

Nichia Corp. White LED Part No. NSPW300BS, Specification for Nichia White LED , Model NSPW300BS., Jan. 14, 2004.
Nicha Corp., White LED Part No. NSPW312BS, Specification for Nichia White LED, Model NSPW312BS. Jan. 14, 2004.
Kim J.K et al. "Strongly Enhanced Phosphor Efficiency in GaInN White Light-Emitting Diodes Using Remote Phosphor Configuration and Diffuse Reflector Cup" Japanese Journal of Applied Physics, Japan Society of Applied Physics, Tokyo, JP, vol. 44, No. 20-23, Jan. 1, 2005 RP-001236988, pp. 649-651.
Office Action from related China Application No. 200710142310.7, dated: Dec. 11, 2009.
Search Report related to International Application No. PCT/CN2008/070298, May 10, 2008, and Written Opinion of the International Search Authority, May 13, 2008.
Preliminary Notice of Reasons for Refusal re related Japanese Application No. 2009-002857, dated: Apr. 24, 2009, pp. 1-2.
Preliminary Notice of Reasons for Refusal re related Japanese Application No. 2009-002857, dated: Jul. 24, 2009.
Declaration of Gerald Negley under 37 C.F.R. § 1.132, dated: Aug. 20, 2009.
Declaration of Charles Swoboda under 37 C.F.R. § 1.132, dated: Aug. 19, 2009.
International Search Report for PCT/CN2009/074800 mailed Feb. 25, 2010.
Office Action from U.S. Appl. No. 11/149,998, dated: Nov. 20, 2009.
Response to Office Action from U.S. Appl. No. 11/149,998, dated: Feb. 22, 2010.
Office Action from U.S. Appl. No. 12/154,691, dated: Dec. 17, 2009.
Response to Office Action from U.S. Appl. No. 12/154,691, dated: May 17, 2010.
Office Action from U.S. Appl. No. 11/465,120, dated: Mar. 9, 2010.
Office Action from U.S. Appl. No. 12/152,766, dated: Mar. 12, 2010.
Office Action from U.S. Appl. No. 12/321,059, dated: May 17, 2010.
Office Action from U.S. Appl. No. 11/149,998, dated: May 18, 2010.
Appeal Decision in Japanese Design Patent Application No. 2009-002857 (Appeal No. 2010-002154) mailed Aug. 20, 2010.
Notification of First Office Action in counterpart application CN 200880009255.7 mailed Sep. 26, 2010.
International Search Report and Written Opinion from PCT/CN2010/001009 mailed Oct. 21, 2010.
International Search Report and Written Opinion from PCT/US2010/001852 mailed Nov. 11, 2010.
CREE® XLAMP® MC-E LEDS Product Info Sheets, p. 1-3.
Nichia Corporation LEDs, Models NSSM016G, NSSM227, NESM026X, NSSM026BB, NESM005A, 9 Pages.
Office Action in related U.S. Appl. No. 12/002,410, dated: Apr. 26, 2011.
Office Action in related U.S. Appl. No. 12/002,410, dated: May 25, 2010.
Office Action in related U.S. Appl. No. 12/002,410, dated: Dec. 13, 2010.
Office Action in related U.S. Appl. No. 11/149,998, dated: May 11, 2011.
Office Action in related U.S. Appl. No. 11/149,998, dated: Aug. 27, 2010.
Office Action in related U.S. Appl. No. 11/149,998, dated: Jan. 24, 2011.
Office Action in related U.S. Appl. No. 11/149,998, dated: Nov. 20, 2009.
Response to OA in related U.S. Appl. No. 11/149,998, dated: Nov. 20, 2009, Response filed: Feb. 22, 2010.
Office Action in related U.S. Appl. No. 11/149,998, dated: May 18, 2010.
Office Action in related U.S. Appl. No. 12/291,293, dated: May 27, 2010.
Office Action in related U.S. Appl. No. 12/291,293, dated: Sep. 3, 2010.

(56) References Cited

OTHER PUBLICATIONS

Office Action in related U.S. Appl. No. 12/291,293, dated: Mar. 1, 2011.
Office Action in related U.S. Appl. No. 11/496,922, dated: Jun. 10, 2010.
Office Action in related U.S. Appl. No. 11/496,922, dated: Dec. 15, 2010.
Office Action in related U.S. Appl. No. 12/152,766, dated: Oct. 7, 2010.
Office Action in related U.S. Appl. No. 12/152,766, dated: Apr. 1, 2011.
Office Action in related U.S. Appl. No. 12/152,766, dated: Mar. 12, 2010.
Office Action in related U.S. Appl. No. 11/465,120, dated: Sep. 8, 2010.
Office Action in related U.S. Appl. No. 11/465,120, dated: Dec. 13, 2010.
Office Action in related U.S. Appl. No. 11/465,120, dated: Mar. 9, 2010.
Office Action in related U.S. Appl. No. 12/635,818, dated: Oct. 14, 2010.
Office Action in related U.S. Appl. No. 12/695,978, dated: Dec. 20, 2010.
Office Action in related U.S. Appl. No. 12/695,978, dated: May 10, 2011.
Office Action in related U.S. Appl. No. 12/154,691, dated: Dec. 17, 2009.
Response to OA in related U.S. Appl. No. 12/154,691, dated: Dec. 17, 2009, Response filed: May 17, 2010.
Office Action in related U.S. Appl. No. 12/321,059, dated: May 17, 2010.
First Office Action for Chinese Patent Application No. CN 200710152109.7 issued Jul. 29, 2011.
Office Action from U.S. Appl. No. 12/291,293, dated: Jul. 19, 2011.
Response to Office Action from U.S. Appl. No. 12/291,293, OA dated: Jul. 19, 2011, Resp. dated: Oct. 19, 2011.
Office Action from U.S. Appl. No. 11/465,120, dated: Jun. 14, 2011.
Office Action from U.S. Appl. No. 12/321,059, dated: Jun. 22, 2011.
Response to Office Action from U.S. Appl. No. 12/321,059, OA dated: Jun. 22, 2011, Resp. dated: Aug. 22, 2011.
Office Action from U.S. Appl. No. 12/321,059, dated: Aug. 26, 2011.
Response to Office Action from U.S. Appl. No. 12/321,059, OA dated: Jun. 22, 2011, Resp. dated: Sep. 20, 2011.
Office Action from U.S. Appl. No. 11/496,922, dated: Jul. 5, 2011.
Office Action from U.S. Appl. No. 12/695,978, dated: Sep. 14, 2011.
Office Action from U.S. Appl. No. 11/149,998, dated: Sep. 21, 2011.
Office Action from U.S. Appl. No. 12/321,059, dated: Oct. 4, 2011.
Notice of Reasons for Rejection for Japanese Patent Application No. 2007-211901 dated Apr. 14, 2011.
International Preliminary Report on Patentability for PCT/CN2010/070073 mailed Apr. 28, 2011.
International Search Report and Written Opinion for PCT/CN2010/001865 mailed Jun. 9, 2011.
Notice of Reasons for Rejection for Japanese Patent Application No. JP 2008-515699 dated May 19, 2011.
Notice of Reasons for Rejection for Japanese Patent Application No. JP 2009-507195 dated Jun. 10, 2011.
Notice of Reasons for Rejection for Japanese Patent Application No. JP 2008-281533 dated Jun. 24, 2011.
First Office Action for Chinese Patent Application No. 200980153995.2 , dated May 4, 2012.
First Office Action for Chinese Patent Application No. 200910145412.3, dated Apr. 28, 2012.
Extended Supplementary European Search Report for application No. EP 07789665.2 dated Nov. 7, 2011.
Second Office Action for counterpart Chinese Patent Application No. CN200880009255.7 mailed Oct. 13, 2011.
International Search Report and Written Opinion for PCT Application No. PCT/US2011/001457 mailed Dec. 13, 2011.
Decision of Rejection for Japanese Patent Application No. 2007-211901, dated: Jan. 30, 2012.
Notification of the First Office Action from Chinese Patent Application No. 201010167346.2, dated Feb. 29, 2012.
Office Action from U.S. Appl. No. 11/465,120, mailed Dec. 9, 2011.
Office Action from U.S. Appl. No. 12/002,410, mailed Mar. 28, 2012.
Office Action from U.S. Appl. No. 12/002,410, mailed Dec. 21, 2011.
Response to Office Action for Appl. No. 12/002,410, filed Mar. 8, 2012.
Office Action from U.S. Appl. No. 12/757,179, mailed Jan. 19, 2012.
Office Action from U.S. Appl. No. 11/496,922, mailed Feb. 9, 2012.
Response to Office Action for U.S. Appl. No. 11/496,922, filed Apr. 6, 2012.
Advisory Action for U.S. Appl. No. 11/496,922, mailed Apr. 18, 2012.
Office Action from U.S. Appl. No. 12/321,059, mailed Feb. 10, 2012.
Response to Office Action for U.S. Appl. No. 12/321,059, filed Apr. 9, 2012.
Advisory Action from U.S. Appl. No. 12/321,059, mailed Apr. 20, 2012.
Office Action from U.S. Appl. No. 12/695,978, mailed Mar. 14, 2012.
Office Action from U.S. Appl. No. 11/982,275, mailed Mar. 23, 2012.
Office Action from U.S. Appl. No. 12/614,989, mailed Mar. 12, 2012.
First Office Action for Chinese Patent Application No. 201110039138.9, dated Jun. 4, 2012.
Decision of Rejection from Japanese Patent Application No. 2008-515699, dated Jul. 17. 2012.
Interrogation from Japanese Patent Application No. 2007-211901, dated Aug. 21, 2012.
Examination Report from European Patent Application No 07789665.2, dated Aug. 20, 2012.
Decision of Rejection from Chinese Patent Application No. 200880009255.7, dated Sep. 5, 2012.
Notice of Reasons for Rejection from Japanese Patent Application No. 2009-507195, dated May 8, 2012.
First Office Action from Chinese Patent Application No. 201080001658.4, dated Sep. 24, 2012.
Extended Search Report for European Patent Application No. 09824413.0-1551, dated Feb. 11, 2013.
Communication from European Patent Appl. No. 09824413.0-1551, dated Feb. 28, 2013.
European Search Report from European Patent Appl. No. 09824413.0-1551, dated Fab. 11, 2013.
Notice of Reasons for Rejection from Japanese Patent Appl. No. 2011-534993, dated Mar. 12, 2013.
Notification of the Second Office Action from Chinese Patent Application No. 201010167346.2, dated Feb. 17. 2013.
Decision of Rejection from Japanese Patent Application No. 2009-507195, dated May 21, 2013.
Notice of Reasons for Rejection from Japanese Patent Appl. No. 2011-259253, dated May 28, 2013.
Decision of Rejection from Japanese Patent Appl. No. 2008-281533, dated May 28, 2013.
Decision of Rejection from Chinese Patent Appl. No. 201080001658.4, dated Jun. 20, 2013.
Office Action from U.S. Appl. No. 12/868.567, dated Jul. 5, 2013.
Office Action from U.S. Appl. No. 12/875,873, dated Jul. 3, 2013.
Office Action from U.S. Appl. No. 11/496,922, dated Jun. 26, 2013.
Office Action from U.S. Appl. No. 12/757,891, dated Jun. 18, 2013.
Office Action from U.S. Appl. No. 11/982,275, dated May 9, 2013.
Office Action from U.S. Appl. No. 11/149,998, filed Apr. 3, 2013.
Response to OA from U.S. Appl. No. 11/149,998, filed Jun. 25, 2013.
Office Action from U.S. Appl. No. 12/868,567, dated Sep. 12, 2012.
Response to OA from U.S. Appl. No. 12/868,567, filed Jan. 14, 2013.

(56) References Cited

OTHER PUBLICATIONS

Office Action from U.S. Appl. No. 11/982,275, dated Sep. 18, 2012.
Response to OA from U.S. Appl. No. 11/982,275, filed Sep. 27, 2012.
Office Action from U.S. Appl. No. 12/002,410, dated Sep. 25, 2012.
Response to OA from U.S. Appl. No. 12/002,410, filed Dec. 18, 2012.
Office Action from U.S. Appl. No. 11/465,120, dated Aug. 21, 2012.
Response to OA from U.S. Appl. No. 11/465,120, filed Aug. 24, 2012.
Office Action from U.S. Appl. No. 12/875,873, dated Aug. 22, 2012.
Response to OA from U.S. Appl. No. 12/875,873, filed Nov. 19, 2012.
Office Action from U.S. Appl. No. 11/465,120, dated Jun. 19, 2012.
Response to CA from U.S. Appl. No. 11/465,120, filed Aug. 15, 2012.
Office Action from U.S. Appl. No. 11/982,275, dated Jul. 9, 2012.
Response to OA from U.S. Appl. No. 11/982,275, filed Sep. 18, 2012.
Office Action from U.S. Appl. No. 12/757,179, dated Jul. 16, 2012.
Response to OA from U.S. Appl. No. 12/757,179, filed Sep. 25, 2012.
Office Action from U.S. Appl. No. 11/982,275, dated Nov. 28, 2012.
Response to OA from U.S. Appl. No. 11/982,275, filed Mar. 21, 2013.
Office Action from U.S. Appl. No. 11/496,922, dated Nov. 23, 2012.
Response to OA from U.S. Appl. No. 11/496,922, filed Apr. 23, 2013.
Office Action from U.S. Appl. No. 12/757,891, dated Nov. 28, 2012.
Response to OA from U.S. Appl. No. 12/757,891, filed Jan. 28, 2013.
Office Action from U.S. Appl. No. 13/306,589, dated Feb. 20, 2013.
Response to OA from U.S. Appl. No. 13/306,589, filed May 16, 2013.
Office Action from U.S. Appl. No. 12/002,410, dated Jan. 29, 2013.
Response to OA from U.S. Appl. No. 12/002,410, filed Apr. 18, 2013.
Office Action from U.S. Appl. No. 12/868,567, dated Feb. 22, 2013.
Response to OA from U.S. Appl. No. 12/868,567, filed May 21, 2013.
Office Action from U.S. Appl. No. 12/875,873, dated Feb. 21, 2013.
Response to OA from U.S. Appl. No. 12/875,873, filed Apr. 19, 2013.
Office Action from U.S. Appl. No. 12/291,293, dated Feb. 28, 2013.
Response to OA from U.S. Appl. No. 12/291,293, filed Jun. 5, 2013.
Office Action from U.S. Appl. No. 12/695,978, dated Apr. 18, 2013.
Response to OA from U.S. Appl. No. 12/695,978, filed Jul. 10, 2013.
Office Action from U.S. Appl. No. 11/149,998, dated Jul. 26, 2013.
Office Action from U.S. Appl. No. 11/982,275, dated Aug. 8, 2013.
Office Action from U.S. Appl. No. 12/291,293, dated Aug. 20, 2013.
Fourth Office Action from Chinese Patent Appl. No. 200710152109.7, dated Jun. 28, 2013.
Notification of Loss of Rights from European Patent Appl. No. 09824413.0, dated Oct. 17, 2013.
Appeal board's Questioning from Japanese Patent Appl. No. 2011-545616, dated Nov. 12, 2013.
Office Action from U.S. Appl. No. 11/496,922, dated Oct. 9, 2013.
Office Action from U.S. Appl. No. 12/875,873, dated Oct. 18, 2013.
Appeal Decision from Japanese Patent Appl. No. 2008-515699, dated Sep. 20, 2013.
Decision of Rejection from Chinese Patent Appl. No. 201001067346.2, dated Aug. 30, 2013.
Office Action from Japanese Patent Appl. No. 2012-288000, dated Oct. 8, 2013.
Decision of Rejection from Chinese Patent Appl. No. 201110039138.9 dated Sep. 25, 2013.
Office Action from U.S. Appl. No. 12/695,978, dated Sep. 17, 2013.
Office Action from U.S. Appl. No. 13/652,241, dated Sep. 11, 2013.
Office Action from U.S. Appl. No. 12/002,410, dated Sep. 10, 2013.
Fifth Office Action from Chinese Patent Appl. No. 2007/10152109.7, dated Jan. 6, 2014.
Supplemental European Search Report from European Patent Appl. No. 10731037.7, dated Jan. 9, 2014.
Search Report for European Patent Appl. No 10731037.7, dated Dec. 11, 2013.
Notice of Reasons for Rejection from Japanese Patent Appl. No. 2011-534993, dated Nov. 12, 2013.
Interrogation from Japanese Patent Appl. No. 2009-507195, dated Jan. 28, 2014.
Interrogation from Japanese Patent Appl. No. 2008-281533, dated Jan. 21, 2014.
International Search Report and Written Opinion from PCT/US2013/073921, dated Feb. 18, 2014.
Decision of Registration from Japanese Design Appl. No. 2012-030304, dated Jan. 21, 2014.
Office Action from U.S. Appl. No. 12/757,891, dated Jan. 14, 2014.
Office Action from U.S. Appl. No. 12/695,978, dated Jan. 31, 2014.
Office Action from U.S. Appl. No. 12/002,410, dated Feb. 4, 2014.
Notification of Reexamination from Chinese Patent Appl. No. 2008800092557, dated May 12, 2014.
Examination from European Patent Appl. No. 09 824 413.0-1551, dated May 16, 2014.
Decision on Rejection from Chinese Patent Appl. No. 2007101521097, dated Mar. 17, 2014.
First Office Action from Chinese Patent Appl. No. 201080027586.0, dated Feb. 8, 2014.
Decision of Rejection from Japanese Patent Appl. No 2011-259253, dated Mar. 25, 2014.
Office Action from Russian Patent Appl No. 2011146934/28, dated Feb. 28, 2014.
Second Office Action from Chinese Patent Appl. No. 201210046248.2, dated Apr. 15, 2014.
Partial European Search Report from European Patent Appl. No. 08253519.6-1564, dated Apr. 29, 2014.
Office Action from U.S. Appl. No. 12/875,873, dated Feb. 25, 2014.
Office Action from U.S. Appl. No. 13/652,241, dated Mar. 12, 2014.
Search Report from Chinese Patent Appl. No. 201210046248.2, dated Apr. 15. 2014.
International Preliminary Report on Patentability from PCT/US2012/065060, dated Jun. 12. 2014.
Office Action from U.S. Appl. No. 11/982,275, dated Apr. 30, 2014.
Office Action from U.S. Appl. No. 12/002,410, dated May 20, 2014.
Reason for Rejection from Japanese Patent Appl. No. 2009-507195, dated Jul. 15, 2014.
Notification of Allowance from Taiwan Appl. Patent No. 103202911, dated Jul. 16, 2014.
Office Action from Japanese Patent Appl. No. 2008-81533, dated Jul. 22, 2014.
Third Office Action and Search Report from Chinese Patent Appl. No. 2011100391389, dated Jun. 23, 2014.
Extended European Search Report from European Patent Appl. No. 08253519.6, dated Aug. 13, 2014.
Office Action from U.S. Appl. No. 12/875,873, dated Jun. 25, 2014.
Response to OA from U.S. Appl. No. 12/875,873, filed Aug. 12, 2014.
Office Action from U.S. Appl. No. 12/695,978, dated Jul. 16, 2014.
Response to OA from U.S. Appl. No. 12/695,978, filed Aug. 11, 2014.
Reasons for Rejection from Japanese Patent Appl. No. 2011-534993, dated Oct. 7, 2014.
Second Office Action from Chinese Patent Appl. No. 201080027586.0, dated Sep. 16, 2014.
Third Action from Chinese Patent Appl. No. 2012100462482, dated Oct. 10, 2014.
Decision of Re-Examination from Chinese Appl No. 200880009255.7, dated Oct. 22, 2014.
Pretrial Report from Japanese Appl. No. 2011-259253, dated Sep. 30. 2014.
Decision of Rejection from Japanese Appl. No. 2012-288000, dated Oct. 28, 2014.
Fourth Office Action from Chinese Appl. No. 2011100391389, dated Nov. 24, 2014.

(56) References Cited

OTHER PUBLICATIONS

Decision of Patent Grant from Japanese Appl. No. 2011-534993, dated Dec. 24, 2014.
Office Action from U.S. Appl. No. 12/875,873, dated Oct. 3, 2014.
Office Action from U.S. Appl. No. 11/982,275, dated Oct. 15, 2014.
Office Action from U.S. Appl. No. 12/002,410, dated Nov. 4, 2014.
Office Action from U.S. Appl. No. 13/652,241, dated Nov. 19, 2014.
Notification of Reexamination from Chinese Appl. No. 2010800016584, dated Sep. 11, 2014.
Decision to Grant from Russian Patent Appl. No. 2011146934/28, dated Aug. 14. 2014.
Appeal Decision from Japanese Patent Appl No. 2013-18375, dated Mar. 10, 2015.
Office Action from Japanese Patent Appl. No. 2013-18883, dated Feb. 24, 2015.
Noting of loss of rights from European Patent Appl. No. 08253519.6-1558/2056363, dated Apr. 16, 2015.
Notice of Reasons for Rejection from Japanese Patent Appl. No. 2011-259253, dated Feb. 3, 2015.
Office Action from U.S. Appl. No. 12/875,873, dated Mar. 2, 2015.
Response from U.S. Appl. No. 12/875,873, filed Apr. 22, 2015.
Office Action from U.S. Appl. No. 13/652,241, dated Mar. 17, 2015.
Office Action from U.S. Appl. No. 13/804,309, dated Mar. 10, 2015.
Examination Report from EU Application No. 07 789 665.2, dated Jan. 21, 2015.
Third Office Action from Chinese Appl. No. 201080027586.0, dated Jan. 21, 2015.
Office Action from Taiwanese Appl. No. 099113616, dated Dec. 26, 2014.
Office Action from U.S. Appl. No. 12/002,410, dated Feb. 23, 2015.
Third Office Action from Chinese Appl. No. 2008800092557, dated Dec. 29, 2014.
Notification of Reexamination from Chinese Appl. No. 2010101673462, dated Jan. 12, 2015.
Patent Certificate from Chinese Patent Appl. No. ZL2008800092557, dated Jul. 15, 2015.
Notice of Allowance from Taiwanese Patent Appl. No. 099113616, dated Sep. 2, 2015.
Office Action from U.S. Appl. No. 13/652,241, dated Sep. 11, 2015.
Office Action from U.S. Appl. No. 14/478,571, dated Oct. 1, 2015.
Notice of Issuance from Chinese Appl. No. 201210046248.2, dated Jun. 11, 2015.
Examination Report from Taiwanese Appl. No. 100130234, dated Jun. 24, 2015.
Examination Report from Taiwanese Patent Appl. No. 100131665, dated Jul. 8, 2015.
International Preliminary Report on Patentability from appl. No. PCT/US2013/073921, dated Jun. 25, 2015.
Pretrial Report from Japanese Appl. No. 2012-288000, dated May 19, 2015.
Fourth Office Action from Chinese Patent Appl. No. 201080027586.0, dated Jul. 29, 2015.
Notice of Allowance from Chinese Appl. No. 200880009255.7, dated Apr. 2, 2015.
Office Action from European Patent Appl. No. 07840092.6-1551, May 4, 2015.
Notice of Completion of Pretrial Reexamination from Japanese Appl. No. 2012-288000, dated May 22, 2015.
First Office Action from Chinese Patent Appl. No. 2011800511887, dated Apr. 30, 2015.
Office Action from U.S. Appl. No. 12/002,410, dated Jun. 17, 2015.
Response to OA from U.S. Appl. No. 12/002,410, filed Aug. 14, 2015.
Office Action from U.S. Appl. No. 12/875,873, dated Jun. 29, 2015.
Second Office Action from Chinese Patent Appl. No. 2010106242824, dated Dec. 29, 2015.
Notice of Allowance from Taiwanese Patent Appl. No. 100131665, dated Dec. 15, 2015.
Office Action from U.S. Appl. No. 12/002,410, Nov. 30, 2015.
Reexamination Decision from Chinese Patent Appl. No. 200710152109.7, dated Nov. 26, 2015.
Extended Search Report for European Patent Appl. No. 09824413.0-1551, dated Feb. 11, 2013.
Second Office Action from Chinese Patent Appl. No. 201110039138.9, dated Jan. 31, 2013.
International Search Report and Written Opinion from PCT Application No. PCT/US2012/065060, dated Feb. 20, 2013.
Notice of Allowance from Chinese Patent Appl. No. 201180051188.7, dated Feb. 3, 2016.
Decision of Rejection from Taiwanese Patent Appl. No. 100130234, dated Feb. 22, 2016.
Office Action from U.S. Appl. No. 12/875,873; Jan. 29, 2016.
Office Action from U.S. Appl. No. 14/329,807; Feb. 17, 2016.
Office Action from U.S. Appl. No. 13/652,241; Mar. 10, 2016.
Office Action from U.S. Appl. No. 14/478,571; Apr. 1, 2016.
Notice of Reasons for Rejection from Japanese Patent Application No. 2107-211901, dated Apr. 9, 2013.
Decision of Rejection from Japanese Patent Application No. 2011-545615, dated Apr. 26, 2013.
Foreign Office Action for Chinese Application No. 2012800586074; Dated Nov. 21, 2016.
Office Action for U.S. Appl. No. 14/705,228; Dated Nov. 25, 2016.
Examination Report from European Application No. 7789665.2; Dated Jul. 13, 2016.
Office Action for U.S. Appl. No. 12/875,873; Dated Aug. 12, 2016.
Office Action for U.S. Appl. No. 14/329,807; Dated Aug. 15, 2016.
Foreign Office Action for Chinese Application 2010106242824; Dated Sep. 5, 2016.
Office Action for U.S. Appl. No. 13/652,241; Dated Sep. 29, 2016.
Office Action for Chinese Application No. 2012800586074; Mar. 17, 2016.
Office Action for Chinese Application No. 2010106242824; Apr. 15, 2016.
Office Action for Chinese Application No. 2010101673462; Apr. 26, 2016.
Office Action for U.S. Appl. No. 12/002,410; Jun. 14, 2016.
Office Action for U.S. Appl. No. 14/705,228; Jun. 17, 2016.
Office Action for U.S. Appl. No. 13/652,241; Jul. 1, 2016.
Luxeon Rebel Power Light Source Technical Datasheet DS56; Dated Jul. 2007.
Luxeon Rebel Lumileds Reliability Datasheet RD07; Dated Mar. 2007.
Luxeon rebel Assembly and Handling Information Application Brief AB32; Mar. 2007.
Foreign Notice of Allowance for Taiwan Application No. 100130234; Dated Feb. 9, 2017.
Office Action for U.S. Appl. No. 12/875,873; Dated Feb. 9, 2017.
Office Action for U.S. Appl. No. 14/478,571; Dated Mar. 13, 2017.
Foreign Office Action for European Application No. 7789665.2; Dated Mar. 17, 2017.

\* cited by examiner

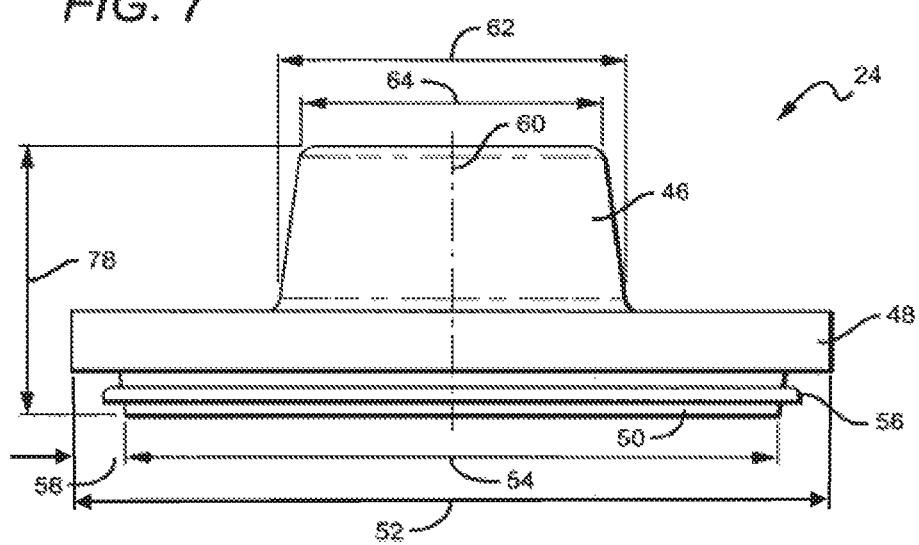
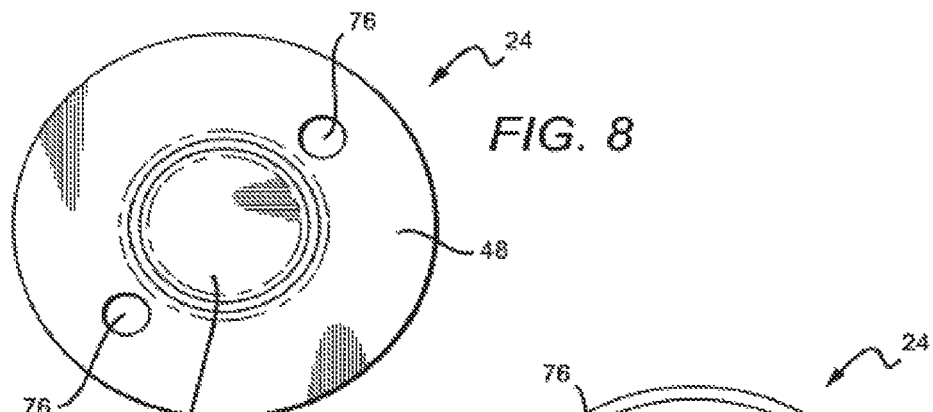
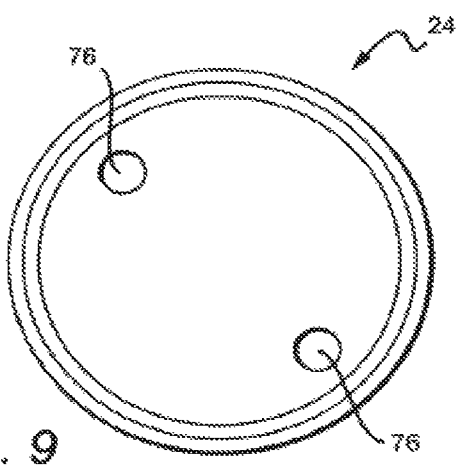

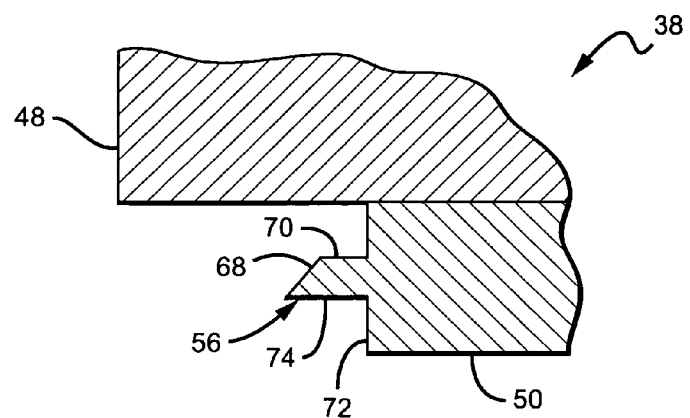
FIG. 10
FIG. 11
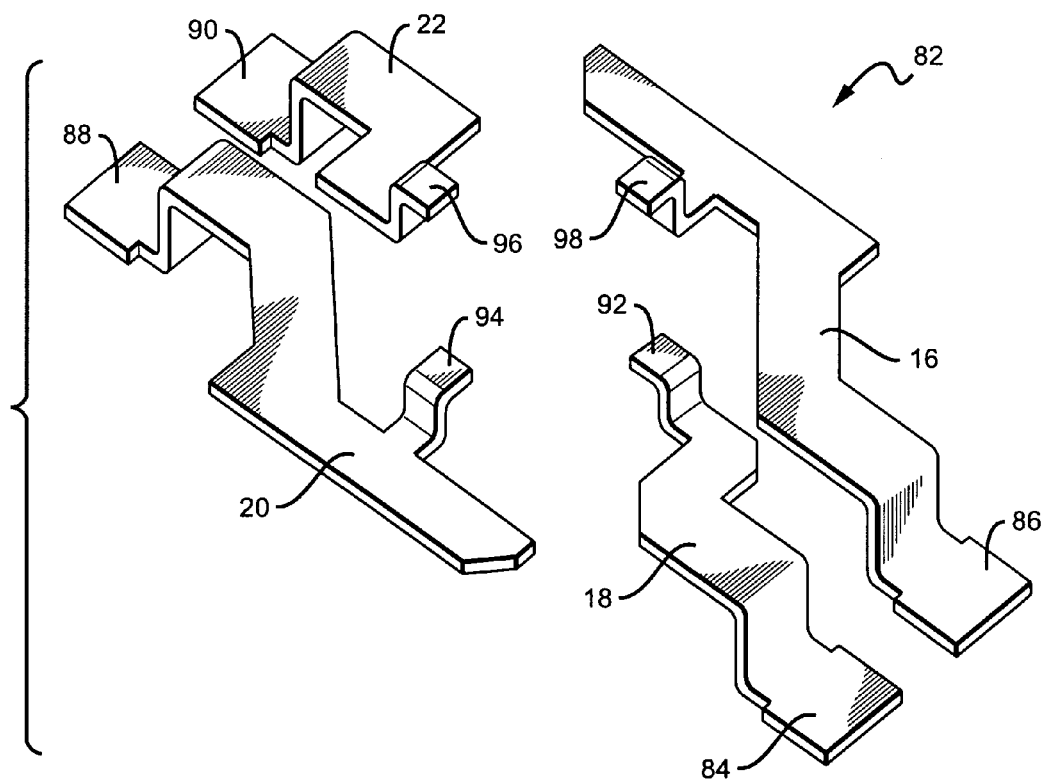

APPARATUS, SYSTEM AND METHOD FOR USE IN MOUNTING ELECTRONIC ELEMENTS

This application claims the benefit of provisional application Ser. No. 60/889,532 to Jian-Hui Xie et al, which was filed on Feb. 12, 2007.

BACKGROUND OF THE INVENTION

Field of the Invention

The present invention generally relates to mounted electronic elements and/or devices, and more particularly to surface mount devices.

Background

In recent decades, there has been a dramatic increase in the number and types of devices utilizing circuit boards. The frequency with which devices and/or chips are mounted onto circuit boards has similarly grown. Improvements in the mounting of devices have helped advance the development of final products incorporating mounted devices and can significantly reduce the cost and complexity of the product.

The mounting of devices can be achieved through soldering, bonding and other similar methods. Further, devices can be mounted in many different configurations and/or orientations and can be configured to allow one or more orientations for mounting. However, it can be difficult to mount some of these devices and/or mountings may deteriorate over time. As a result, the accuracy of the operation of the product incorporating these mounted devices can degrade and/or fail to operate.

SUMMARY OF THE INVENTION

The present invention provides apparatuses, systems, and methods of manufacturing surface mountable devices which allow for one or more mounting orientations while decreasing the difficulty of the mounting process and increasing the life of the mounting. One embodiment provides surface mount devices which comprise a casing with a first surface, second surface, and at least one side surfaces. A recess is formed in the first surface of the casing and extends into the casing. A plurality of leads is partially encased by the casing, and one or more electronic devices are coupled with at least one of the plurality of leads and are at least partially exposed through the recess.

Another embodiment provides surface mount devices with a casing comprising a first surface and a recess formed in said first surface and extending at least partially into said casing. A plurality of leads at least partially encased by said casing and extending from the recess through the casing and exiting the casing. At least one electronic device coupled with at least one of the plurality of leads and at least partially exposed through the recess, and a heat sink proximate said plurality of leads and secured in said recess.

Another embodiment provides surface mount devices with a casing comprising a first surface and a second surface opposite said first surface. A recess is formed in said first surface and extends at least partially into said casing. A lens is positioned relative to and protruding from said first surface. A plurality of leads is at least partially encased by said casing and extends from the recess through the casing and exits the casing, and a heat sink is positioned proximate said plurality of leads and secured in said recess.

Another embodiment provides a method for use in manufacturing a surface mount device. A plurality of leads is positioned, proximate to which a heat sink is placed. The plurality of leads and the heat sink are secured with a casing such that the heat sink is maintained at a predefined position relative to the leads. An electronic device is mounted on the heat sink such that at least a portion of the electronic device is exposed through a recess in the casing.

These and other further features and advantages of the invention would be apparent to those skilled in the art from the following detailed description, taken together with the accompanying drawings, in which:

BRIEF DESCRIPTION OF THE DRAWINGS

FIG. 3 is a side plan view of the embodiment shown in FIG. 1, with the opposite side being substantially similar;

FIG. 5 is a side plan view of the embodiment shown in FIG. 1, with the opposite side being substantially similar;

FIG. 7 is a side plan view of the embodiment shown in FIG. 6, with the opposite side being substantially similar;

FIG. 8 is a top plan view of the embodiment shown in FIG. 6;

FIG. 9 is a bottom plan view of the embodiment shown in FIG. 6;

FIG. 10 is a sectional view of the embodiment shown in FIG. 6;

FIG. 11 is a perspective view of one embodiment of a lead assembly according to the present invention;

FIG. 13 is a side plan view of the embodiment shown in FIG. 11, with the opposite side being substantially similar;

FIG. 16 is a partial side plan view of the embodiment shown in FIG. 15, with the opposite side being substantially similar;

DETAILED DESCRIPTION OF THE INVENTION

The present invention provides apparatuses, systems, methods of manufacturing and methods for mounting electronic devices. The methods for mounting may include, for example, mounting an electronic and/or optoelectronic device onto a circuit board. Some embodiments are particularly applicable to surface mount device (SMD) packages used to mount components such as optoelectronic elements that receive, emit, scatter and/or deflect light. The optoelectronic elements may include one or more light emitting diodes (LED), solar cells, photodiodes, laser diodes, and other such optoelectronic elements or combinations of optoelectronic elements. Some exemplary embodiments of the surface mount device packages are designed, at least in part, to stabilize the optoelectronic elements or combinations and/or dissipate heat from the optoelectronic element.

Figure 1:
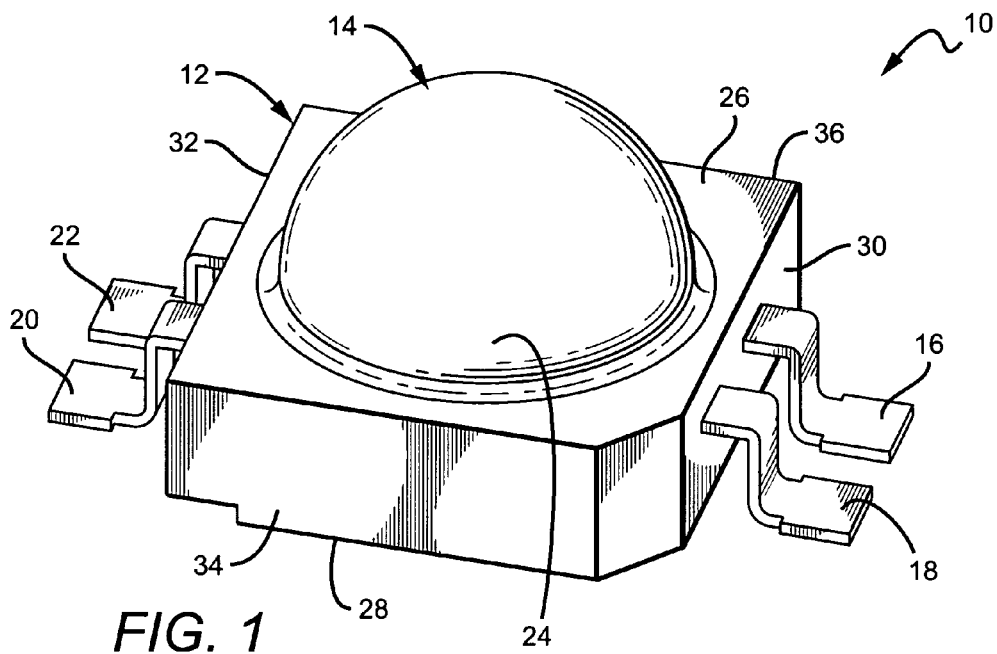
FIG. 1 is a perspective view of one embodiment of a surface mount device according to the present invention.

FIG. 1 shows a perspective view of one embodiment of a surface mount device (SMD) 10 according to the present invention that can be used to mount one or more electronic devices, such as an optoelectronic element. The SMD 10 comprises a casing 12, a lens or dome 14, and a plurality of leads 16, 18, 20, and 22. In some embodiments, SMD 10 may additionally include a heat sink 24 upon which an electronic device such as an optoelectronic device may be mounted.

As depicted in FIG. 1, the casing in some embodiments can have a generally cubical shape, with a first surface 26 opposite a second surface 28. When the SMD 10 is mounted with an optoelectronic element such as a circuit board, the second surface 28 is positioned adjacent to and/or juxtaposed with the circuit board. The SMD 10 can be configured in numerous other relevant shapes without departing from the novel aspects of the SMD 10.

The casing 12 can also include four side surfaces 30, 32, 34, and 36 when having a generally cubic shape. The lens 14 is positioned and typically secured relative to the first surface 26. In some embodiments, the lens 14 may extend and/or protrude from the first surface 26.

Figure 2:
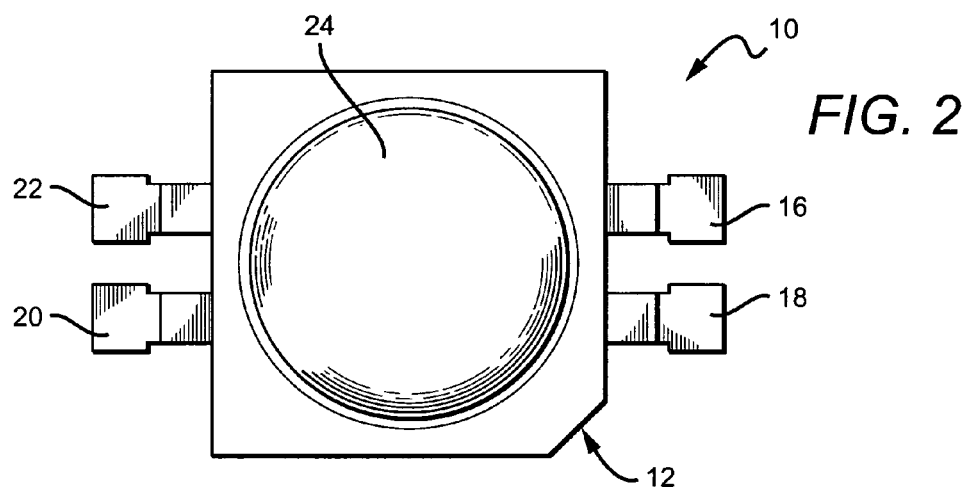
FIG. 2 is a top plan view of the embodiment shown in FIG. 1.
Figure 3:
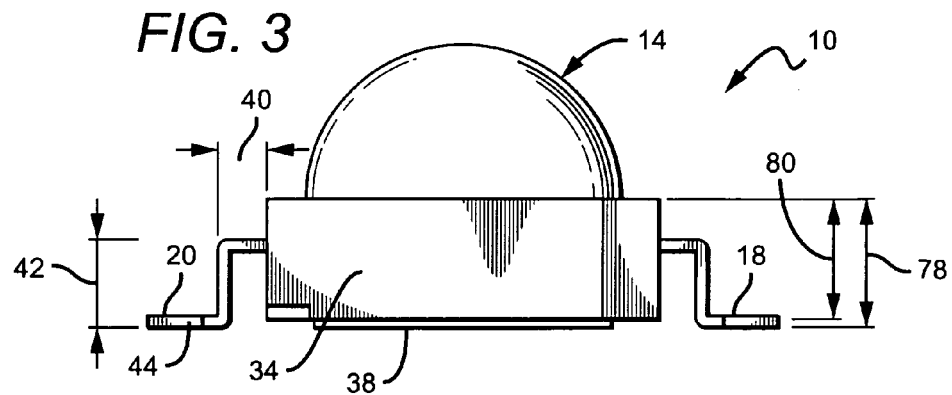
Figure 4:
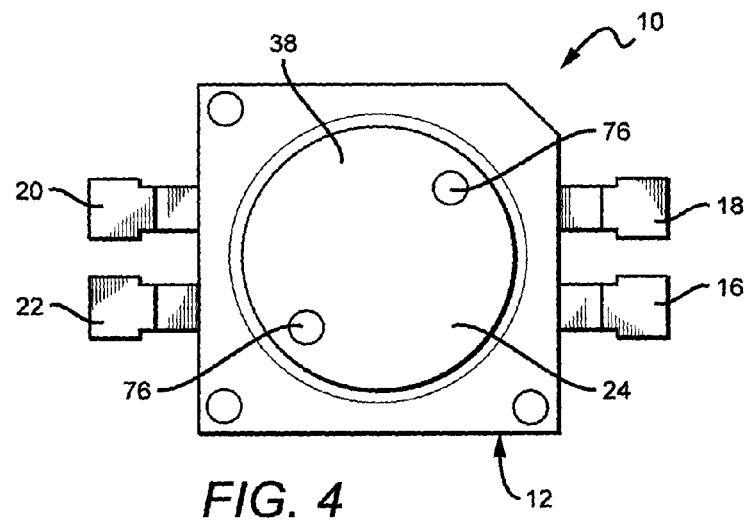
FIG. 4 is a bottom plan view of the embodiment shown in FIG. 1.
Figure 5:
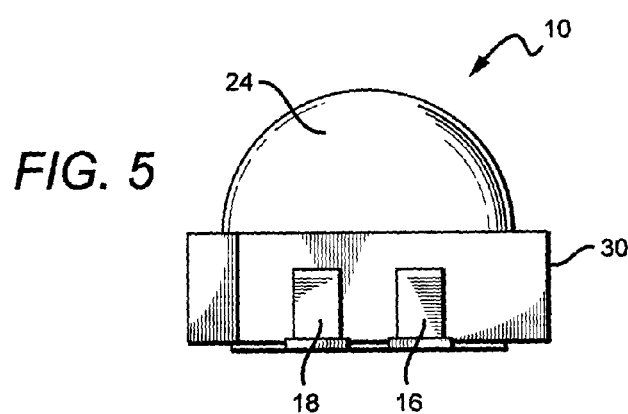

FIGS. 2-5 depict alternate views of the SMD 10 shown in FIG. 1. FIG. 2 shows an overhead view of the first surface 26 of the casing 12 sans lens 14. FIG. 3 shows a side view relative to side surface 34 of the casing 12. FIG. 4 shows the bottom of the second surface 28 of the casing 12, and FIG. 5 shows a side view of the side surface 30.

Referring to FIGS. 1-5, the leads 16, 18, 20, 22 are partially encased by the casing 12, with first and second leads 16, 18 extending through first side surface 30 of the casing 12 and third and fourth leads 20, 22 extending through second side surface 32 of the casing 12. Each lead 16, 18, 20, 22 has an opposite end separated by its exterior length, and portions of the leads 16, 18, 20, 22 extend through the casing 12 and/or are exposed at both ends. The leads 16, 18, 20, 22 exit the first and second side surfaces 30, 32 and are angled, bent, and/or otherwise configured such that they are generally aligned with a contact surface 38 of heat sink 24.

In some embodiments, the leads 16, 18, 20, 22 exit the first and second side surfaces 30, 32 in a generally perpendicular orientation to the side surfaces 30, 32 for a first exterior or exposed length 40, and are then bent to extend generally parallel with respect to the side surfaces 30, 32 for a second exterior length 42. They are then bent again to extend generally parallel with the contact surface 38 of the heat sink 24 for a third exterior length 44. Additionally, in some embodiments the leads 16, 18, 20, 22 increase in width along at least a portion of third exterior length 44 to increase the bonding surface area of the leads when coupling them with a circuit board or other relevant mounting surface.

The leads 16, 18, 20, 22 exit the casing 12 in a generally centered position along the first and second side surfaces 30, 32. However, it is noted that the leads 16, 18, 20, 22 can alternatively exit the casing 12 in a generally un-centered position with respect to side surfaces 30, 32. Further, in still other possible embodiments, leads 16, 18, 20, 22 can exit any or each of side surfaces 30, 32, 34, 36 in a variety of centered or un-centered positions with respect to side surfaces 30, 32, 34, 36.

Figure 6:
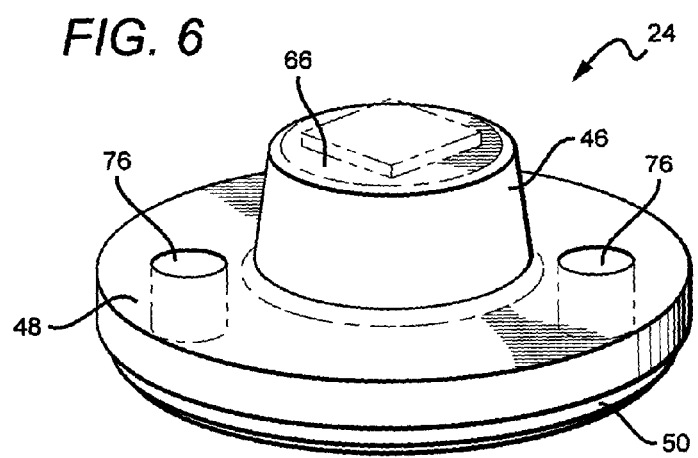
FIG. 6 is a perspective view of one embodiment of a heat sink according to the present invention.

FIG. 6 depicts a heat sink 24 according to some embodiments. FIGS. 7-9 depict alternate views of the heat sink 24 of FIG. 6, with FIG. 7 showing heat 24 from the side, FIG. 8 showing heat sink 24 from the top, and FIG. 9 showing heat sink 24 from the bottom. Heat sink 24 is constructed, at least in part, of thermally conductive material. Suitable materials include, but are not limited to metals and/or metal alloys such as copper, nickel, and other relevant thermal material and/or combinations thereof.

Heat sink 24 can include a protruding or pedestal section 46, an extended section or plate 48, and a base 50. The extended plate 48 extends from and/or is thermally coupled with the base 50, and the pedestal section 46 extends from and/or is thermally coupled with the extended plate 48. While heat sink 24 is depicted as having a generally cylindrical shape with generally circular perimeters, it is understood that the heat sink 24 may be configured in any number of relevant shapes, such as a square, rectangular, or oval.

In some preferred embodiments, the extended plate 48 has a width or diameter 52 that is greater than the width or diameter 54 of the base 50. Further, the base 50 can include a laterally and circumferentially extending projection, ledge, shelf or ring 56. This shelf 56 extends a distance 58 from the base 50, which is typically less than the distance the extended plate 48 extends from the base 50. However, it is understood that the shelf 56 can extend as far as or beyond the extended plate 48 without departing from the novelty of these embodiments.

The pedestal section 46 protrudes from the extended plate 48. In some embodiments, the pedestal section 46 is inclined and/or tapers toward a central axis 60 as it extends away from the extended plate 48 such that the base of the pedestal section 46 proximate to the extended plate 48 has a width or diameter 62 that is greater than the width or diameter 64 at a mounted surface 66. Further, diameter 62 at the base of the pedestal section 46 is typically less than the diameter 52 of the extended plate 48, and is also typically less than the diameter 54 of the base 50.

The mounting surface 66 provides a surface upon which one or more electronic and/or optoelectronic devices 68 can be secured, as shown in phantom line in FIG. 6. Heat is dissipated from the mounted electronic and/or optoelectronic device(s) via the heat sink 24. When the SMD 10 is secured and/or mounted on a device such as a circuit board, the heat sink 24 can be positioned in and/or thermally coupled with a heat sink of the circuit board or other device to further enhance heat dissipation from the mounted electronic and/or optoelectronic device(s).

An electronic and/or optoelectronic device can be mounted and/or secured with the mounting surface 66 of the heat sink 24 via soldering, bonding, and/or any other relevant mounting method or combinations of methods. However, in an exemplary embodiment, the mounting is implemented through a thermally conductive material.

Additionally or alternatively, the electronic device and/or optoelectronic device can include a heat sink that contacts the mounting surface 66.

FIG. 10 shows an enlarged, cross-sectional view of the base 50 and shelf 56 of the heat sink 24 depicted in FIGS. 6-9. In some embodiments, the shelf 56 can taper along a circumferential perimeter 68 toward a central axis 60 (see FIG. 7) of the heat sink 24 and toward the extended plate 48. Typically, the tapering is at such an angle so that a first surface 70 is defined between the tapered perimeter 68 and a side surface 72 of the base 50. The tapered circumferential perimeter 68, the first surface 70, and a second surface 74 of the shelf 56 aid in maintaining the positioning of the heat sink 24 relative to the casing 12 in that the shelf 56 and the surfaces 68, 70, and 74 are encased by the material of the casing 12.

Referring to FIGS. 4 and 6-9, in some embodiments the heat sink 24 further includes one or more bores or through-holes 76. These bores 76 extend through at least the extended plate 48 and the base 50 depending on the diameter 54 of the base. These bores 76 allow material 77 of the casing 12 to extend through the bores 76, as shown in phantom line in FIG. 6, to at least in part further enhance the stability of the heat sink 24 and the electronic and/or optoelectronic device(s) mounted on the mounting surface 66 relative to the casing 12 and/or leads 16, 18, 20, 22.

The height 78 of the heat sink 24 is generally at least equal to the thickness 80 of the casing 12, and in many embodiments is greater than the thickness 80 of the casing 12. For example, the heat sink 24 can be secured within the casing 12 such that a portion of the base section 50 extends below the second surface 28 of the casing 12 and a portion of the pedestal section 46 extends above the first surface 26 of the casing 12.

The dimensions of the heat sink 24 can depend on the one or more anticipated electronic and/or optoelectronic devices that are to be mounted on the mounting surface 66 of the heat sink 24, the dimensions of the casing 12, the expected implementation of the SMD 10, the amount of heat expected to be dissipated by the heat sink 24, the material of the heat sink 24 and/or other such factors. For example, according to some embodiments, the dimensions of the heat sink 24 can include a diameter 52 of the extended plate 48 of approximately 6.6 mm +/−0.5 mm, a height 78 of approximately 2.6 mm +/−0.3 mm, a diameter 62 of the pedestal section 46 of approximately 3.05 mm +/−0.3 mm, a diameter 64 of the pedestal section 46 proximate to the mount surface 66 of about 2.65 mm +/−0.3 mm, with a height of the pedestal section 46 of about 1.55 mm +/−0.3 mm, and the diameter of the bores 76 of about 0.8 mm +/−0.2 mm.

Additionally, in some embodiments the dimensions of the mounting surface 66 of the heat sink 24 are reduced and/or minimized. In some embodiments, the light emissions and/or reception are enhanced by reducing the exposed surface area of the heat sink 24. Further, the exposed area of the contact surface 38 of the base 50 is increased and/or maximized to provide increased heat dissipation.

Figure 12:
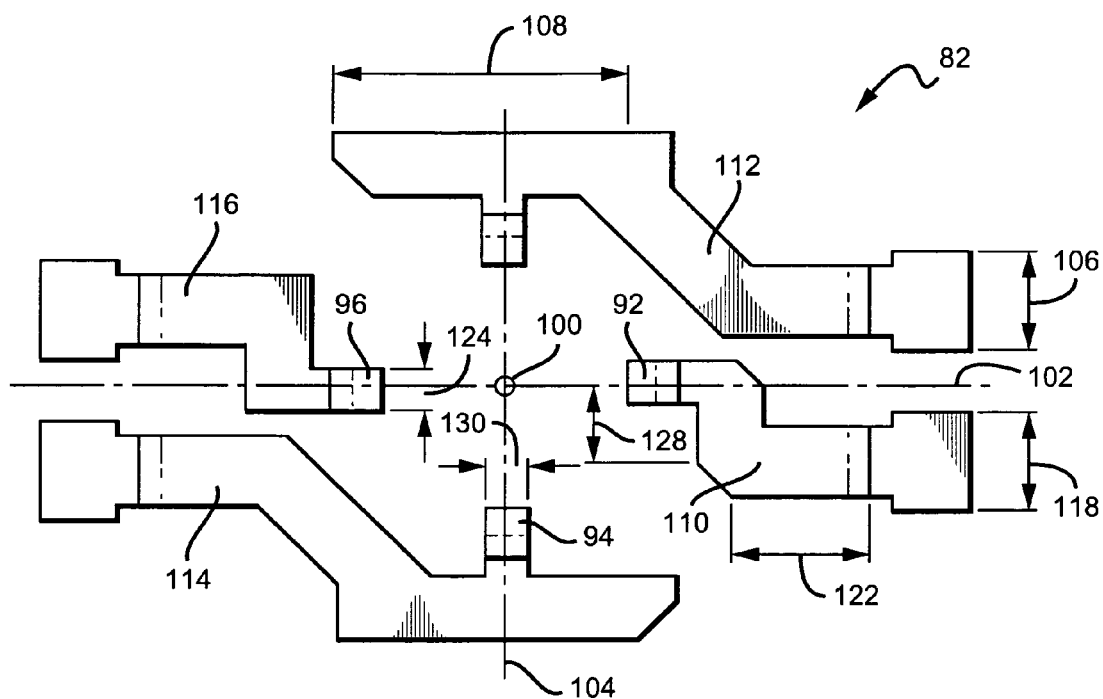
FIG. 12 is a top plan view of the embodiment shown in FIG. 11.
Figure 13:
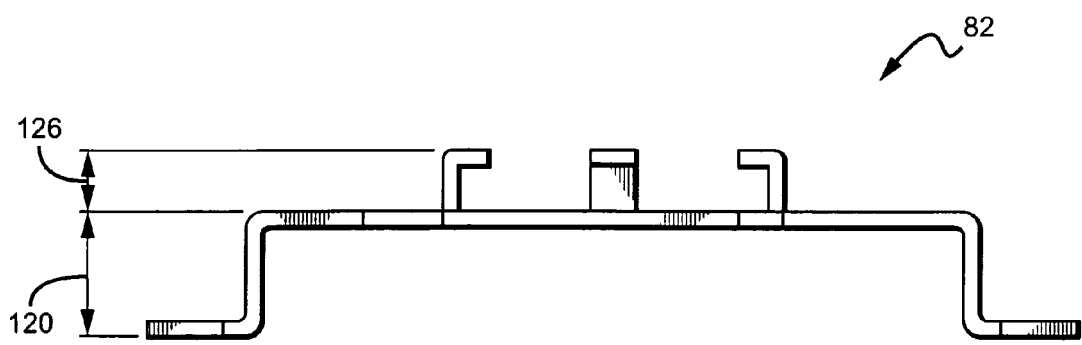

FIG. 11 depicts a lead-assembly 82 according to some embodiments that can be incorporated into SMD 10. FIGS. 12-13 depict alternate views of the lead assembly 82 of FIG. 11, with FIG. 12 showing lead assembly 82 from the top, and FIG. 13 showing lead assembly 82 from the side. Referring to FIGS. 1 and 11-13, the lead assembly 82 includes four leads 16, 18, 20, 22. Each lead extends from a surface mount area 84, 86, 88, 90 at a first end of each lead to a contact or device coupling area or end 92, 94, 96, 98 at a respective opposite end of each lead. In some embodiments, the leads 16, 18, 20, 22 are further constructed of a thermally conductive as well as electrically conductive material. As introduced above, in some embodiments the leads 16, 18, 20, 22 exit the casing 12 on opposite sides 30, 32 and are generally centered on those sides. In some embodiments, the device coupling areas 92, 94, 96, 98 are equally distributed about a central point 100 along axis 102, 104. Further, the device coupling areas 92, 94, 96, 98 are at a height or distance 106 above the surface mount areas 84, 86, 88, 90.

In some embodiments, the surface mount areas 84, 86, 88, 90 are arranged generally parallel with the contact surface 38 of the heat sink 24, and typically with a surface upon which the SMD 10 is to be mounted and/or secured. The surface mount areas 84, 86, 88, 90 have a first width 106 and length 108 providing an area for an electronic couple with a conductive contact, trace and/or conductive area on the surface to which the SMD 10 is being couple (e.g. a circuit board).

Extended lead portions 110, 112, 114, 116 extend from the surface mount areas 84, 86, 88, 90 respectively, to provide a conductive path between the surface mount areas 84, 86, 88, 90 and the device coupling areas 92, 94, 96, 98. In some embodiments, the extended lead portions 110, 112, 114, 116 have a width 118 that is less than the width of the surface mount areas 84, 86, 88, 90. Each lead 16, 18, 20, 22 is bent about 90 degrees from being generally parallel with the contact surface 38 of the heat sink 24, extending along the first and second side surfaces 30, 32 of the casing 12. At a first height 120, each lead 16, 18, 20, 22 is bent again about 90 degrees to be generally parallel with the surface mount areas 84, 86, 88, 90 and the mounting surface 66 of the heat sink 24.

The extended lead portions 110, 112, 114, 116 are then angled to align the device coupling areas 92, 94, 96, 98 with perpendicular axes 102, 104. For example, a first and fourth lead 18, 22 extend from the second bend into the casing 12 a first distance 122 and can include a 90 degree horizontal turn that brings the respective extended lead portions 110, 116 into alignment with the first axis 102, and again includes a 90 degree horizontal turn. The extended leads 110, 116 continue to extend toward the center 100 at a reduced third width 124 that straddles the first axis 102. The extended lead portions 110, 116 of the first and fourth leads 18, 22 include a further 90 degree bend, and extend generally perpendicular to the contact surface 38 of the heat sink 24 a second height 126. At second height 126, a subsequent 90 degree bend defines the device coupling areas 92, 96 that extend generally parallel with the contact surface 38 of the heat sink 24 and are approximately equidistant from the center 100.

The second and third leads 16, 20 include similar turns and bends to position the second and third device coupling areas 94, 98 in alignment with the second axis 104. For example, the second and third leads 16, 20 can extend into the casing 12 the first distance 122 and can then include a first horizontal turn that angles away from the first axis 102 at an angle of about 45 degrees. The extended lead portions 112, 114 include a second horizontal turn that is about 45 degrees such that the extended lead portions 112, 114 continued to extend generally parallel with the first axis 102 a second distance 128. The second and third extended lead portions 112, 114 further include perpendicular extensions that extend generally perpendicular from the extended lead portions 112, 114 along the second length approximately centered with the second length and straddling the second axis 104 with a width 130. The perpendicular extensions of the second and third leads 16, 20 include a further 90 degree bend and extend generally perpendicular to the contact surface 38 of the heat sink 24 to the second height 126, where a subsequent 90 degree bend defines the device coupling areas 94, 98 that: extend generally parallel with the contact surface 38 of the heat sink 24 and are aligned with the second axis 104. They are also approximately equidistant from the center 100.

The lead assembly 82 and the heat sink 24 are positioned such that the contact surface 38 is positioned between the device coupling areas 92, 94, 96, 98. The casing 12 is positioned about the lead assembly 82 and heat sink 24 securing the positioning of the leads 16, 18, 20, 22 relative to the heat sink 24. In some embodiments, the casing 12 is formed using injection molding about the lead assembly 82 and heat sink 24. The heat sink 24 extends beyond the second surface 28 of the casing to be exposed at the contact surface 38. One or more electronic and/or optoelectronic devices are mounted and/or secured with the heat sink 24 such that the heat sink 24 can dissipate heat from the electronic and/or optoelectronic device(s). An LED may then be electrically coupled with two or more of the device coupling areas using a coupling method such as jump wires, although any other suitable coupling method may be used.

The lens 14 is formed about the device coupling areas and the mounted electronic and/or optoelectronic device(s). The lens 14 may be formed from any relevant transparent and/or partially transparent, including but not limited to glass, silicon, plastic, and/or other suitable materials. In some embodiments, the lens 14 is injection molded directly onto the casing 12 about the electronic and/or optoelectronic device(s). A mold is positioned in contact with the first surface 26 of the casing 12, and is typically at least partially sealed with the casing 12. A liquid silicon or other suitable lens material is injected through a wall of the mold into the mold such that the lens can be formed using a single material through a single injection process.

Additionally or alternatively, in other embodiments the mold is positioned in contact with the first surface 26 of the casing 12. A liquid silicon or other suitable material is injected through one or both of the bores 76 of the heat sink 24. As described above, the bores 76 may extend through the base 50 of the extended plate 48. Further, in some embodiments the casing 12 may include corresponding bores that at least partially align with the bores 76 of the heat sink 24. This provides a passage between the base 50 and the area about the mounting surface 66 of the heat sink 24. With the lens mold positioned in contact with the first surface 26, the liquid silicon and/or other suitable material can be injected into the mold and about the electronic and/or optoelectronic device(s) mounted on the mounting surface 66 of the heat sink 24.

Figure 14:
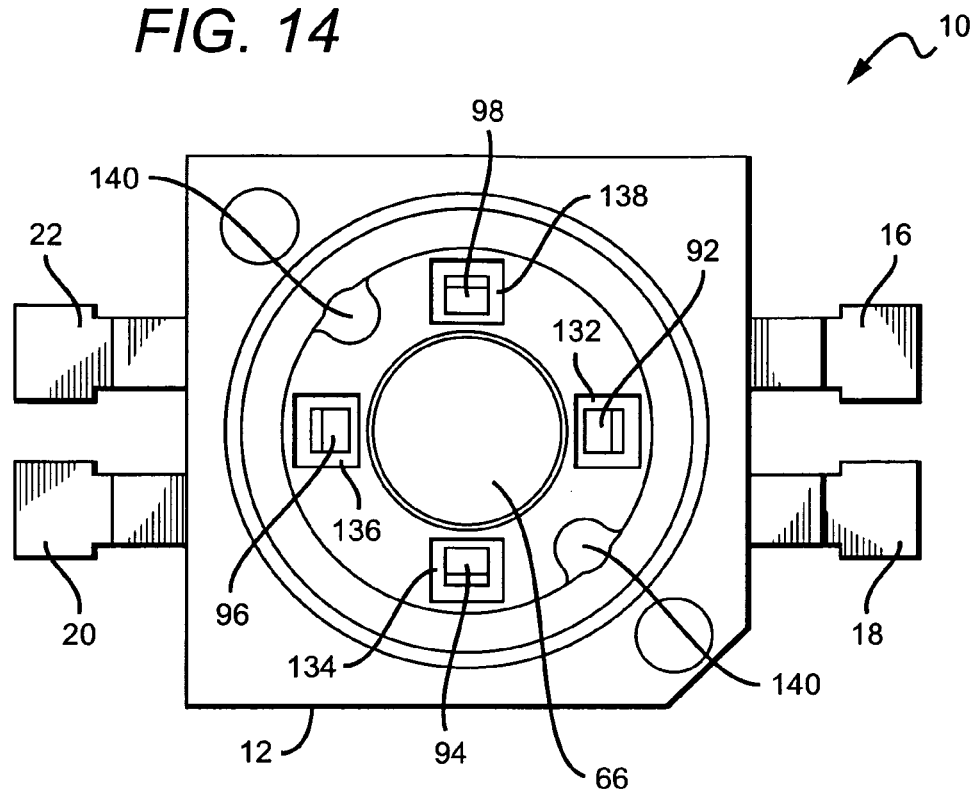
FIG. 14 is a top plan view of a component of the embodiment shown in FIG. 1.

FIG. 14 depicts a simplified top view of the SMD 10 depicted in FIG. 1, but without the lens 14. Referring to FIGS. 1, 6-7, and 14, the heat sink 24 is positioned within the casing 12 such that the mounting surface 66 is proximate to the device coupling areas 92, 94, 96, 98 (see FIG. 11) of the leads 16, 18, 20, 22. In some embodiments, the casing 12 is formed with recesses 132, 134, 136, 138 that at least partially expose the device coupling areas 92, 94, 96, 98. The casing 12 can further include bores 140 that correspond and/or at least partially align with the bores 76 of the heat sink 24.

In some embodiments, the liquid silicon and/or other suitable material is injected through one bore 76 when forming the lens 14. This allows air and/or other gases to escape through the second bore 76. By providing a gas exit the lens 14 can be formed with fewer bubbles within the lens or without any bubbles.

Additionally or alternatively, in some embodiments the lens 14 includes a lens cover (not shown) that forms the outer surface of the lens 14. This lens cover is secured with the casing 12, sealing the area within the lens cover. Silicon and/or other suitable materials can further be injected into the area within the volume of the lens cover to fill the area. In some instances, one bore 76 is used to inject the silicon and/or other suitable material while the other bore 76 can be used to allow gas to escape the volume within the lens cover and about the electronic and/or optoelectronic device(s). The lens cover can be made from glass, plastic, silicon and/or other suitable transparent and/or substantially transparent materials.

Figure 15:
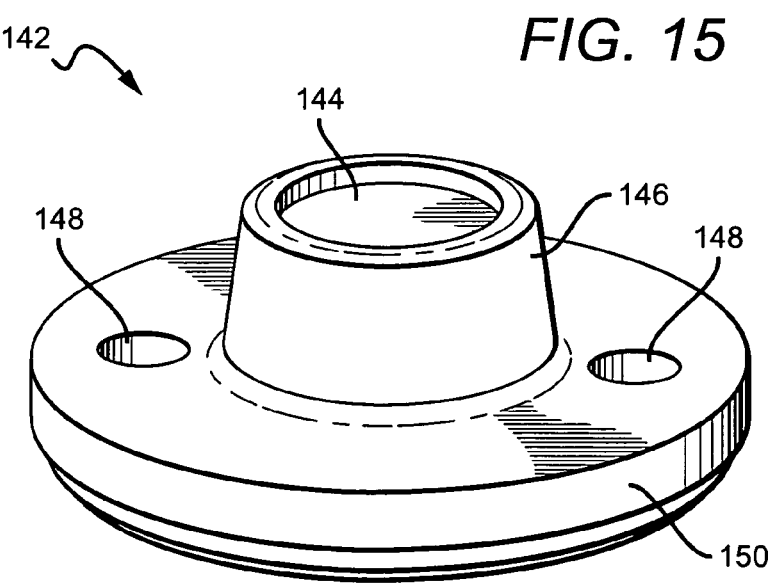
FIG. 15 is a perspective view of one embodiment of a heat sink according to the present invention.
Figure 16:
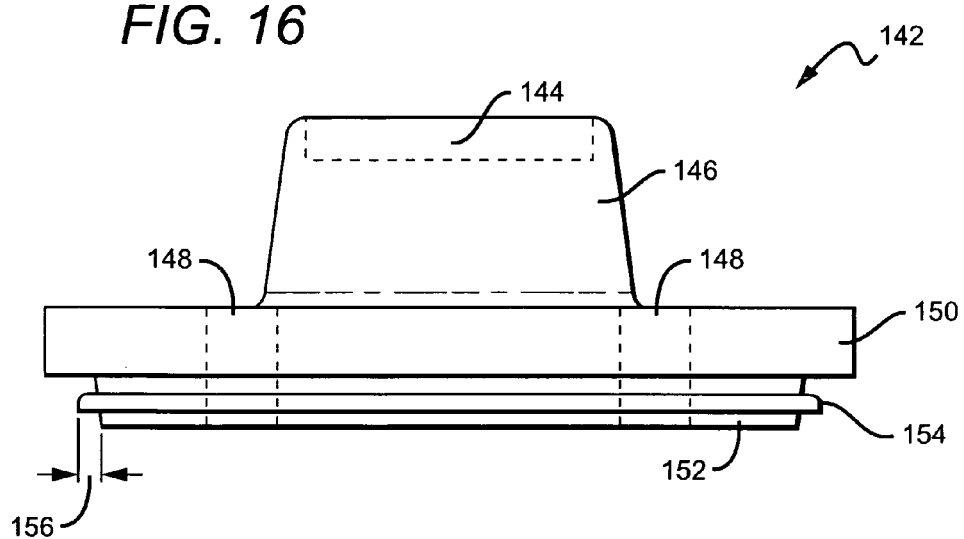
Figure 17:
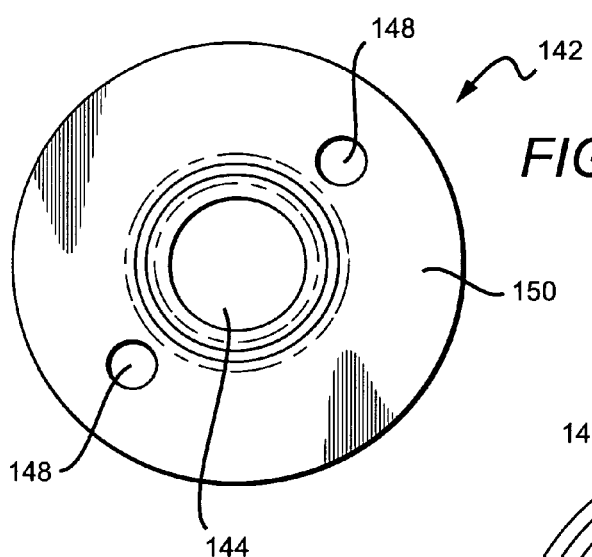
FIG. 17 is a top plan view of the embodiment shown in FIG. 15.
Figure 18:
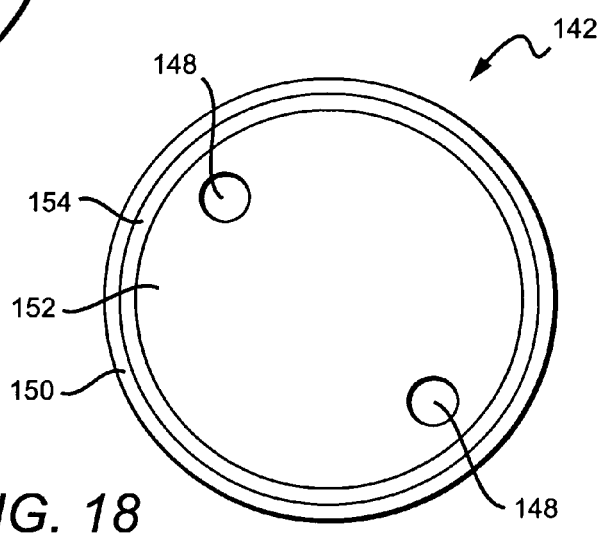
FIG. 18 is a bottom plan view of the embodiment shown in FIG. 15.

FIG. 15 depicts a heat sink 142 according to some embodiments. FIGS. 16-18 depict alternate views of the heat sink 142 of FIG. 15, with FIG. 16 showing a partially transparent heat sink 142 from the side, FIG. 17 showing heat sink 142 from the top, and FIG. 18 showing heat sink 142 from the bottom. The heat sink 142 in some embodiments is similar to the heat sink 24 of FIGS. 6-9. However, the heat sink 142 of FIGS. 15-18 additionally or alternatively includes a recessed mounting surface 144 in the pedestal 146. One or more electronic and/or optoelectronic devices are mounted within the recess on the recessed mounting surface 144. Similar with the heat sink 24 of FIGS. 6-9, in some embodiments the area of the heat sink 142 that is exposed above the casing and within the lens is reduced and/or minimized.

The heat sink 142 further includes bores 148 that extend through at least the extended plate 150, and in some embodiments extend through the base 152 as well. In some embodiments, the base 152 can also include a laterally and circumferentially extending projection, ledge, shelf, or ring 154. This shelf 154 extends a distance 156 laterally from the base 152 that is typically less than the distance the extended plate 150 extends from the base 152 of the pedestal 146. However, it is noted that the shelf 154 can extend as far as or beyond the extended plate 150 without departing from the novelty of these embodiments.

Figure 19:
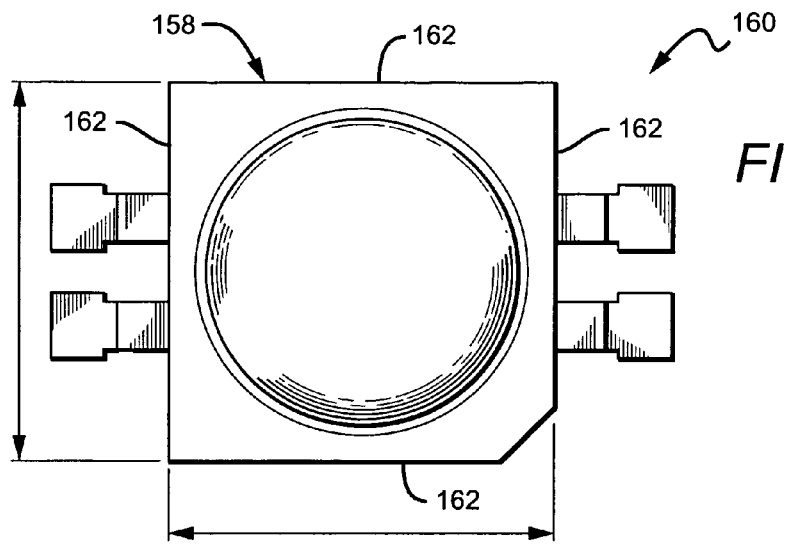
FIG. 19 is a top dimensional view of one embodiment of a surface mount device according to the present invention.
Figure 20:
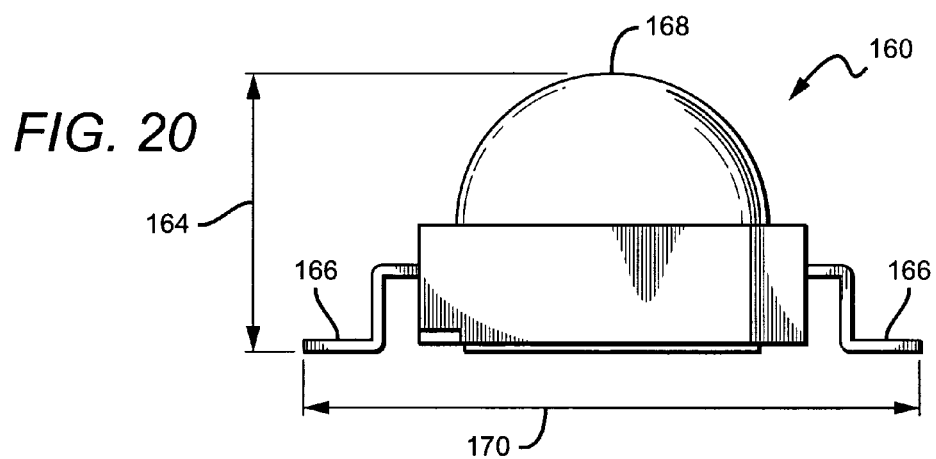
FIG. 20 is a side dimensional view of the embodiment shown in FIG. 19.

FIGS. 19 and 20 depict the dimensions of an SMD 160 according to some embodiments. As discussed above, the dimensions of an SMD can depend on many factors, including the number and/or size of the electronic and/or optoelectronic device(s), the amount of heat to be dissipated, the device and/or circuit board onto which the SMD is to be mounted, and/or other relevant factors. For example, in some embodiments, the casing 158 can be generally square-shaped with sides 162 of approximately 7.50 mm +/−0.5 mm. The height 164 of the SMD 160 can be approximately 5.6 mm +/−0.5 mm from the surface areas of the leads 166 to the peak of the lens 168. The width 170, including the leads and the surface mount areas of the leads, can be approximately 12.0 mm +/−0.5 mm.

Figure 21:
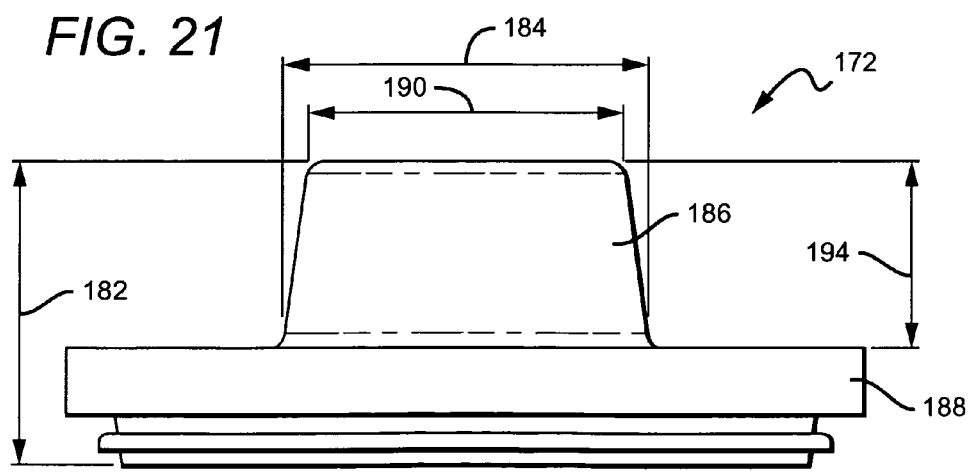
FIG. 21 is a side dimensional view of one embodiment of a heat sink according to the present invention.
Figure 22:
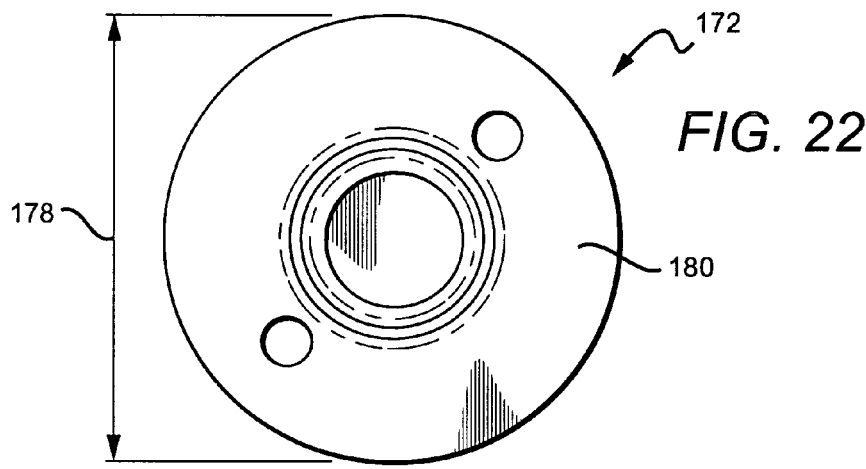
FIG. 22 is a top dimensional view of the embodiment shown in FIG. 21.
Figure 23:
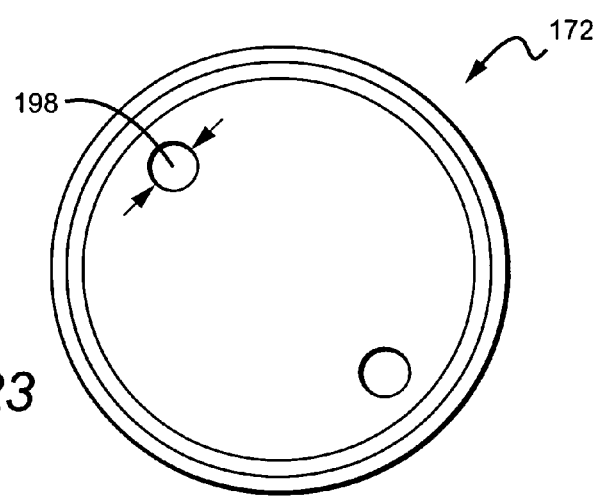
FIG. 23 is a bottom dimensional view of the embodiment shown in FIG. 21.
Figure 24:
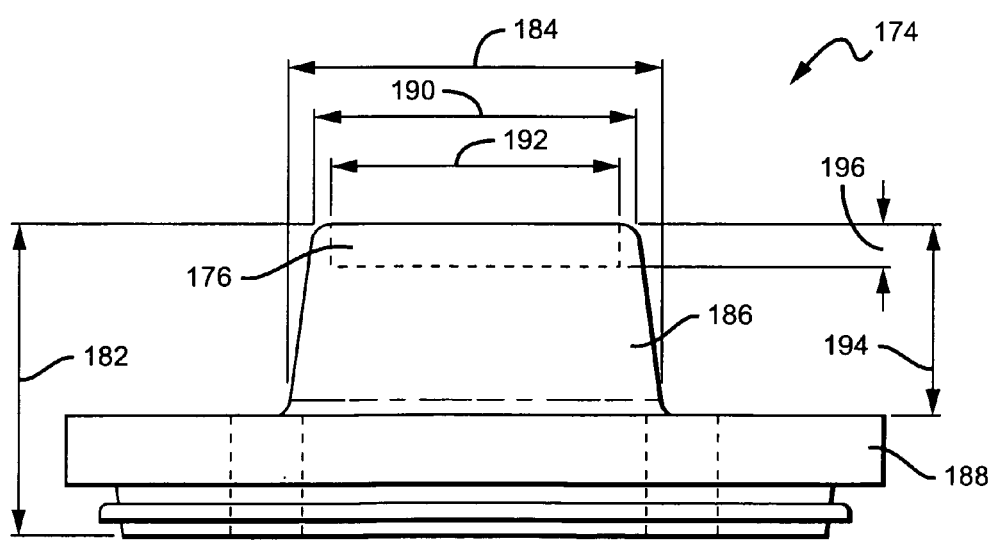
FIG. 24 is a side dimensional view of one embodiment of a heat sink according to the present invention.

FIG. 21 depicts the dimensions of a heat sink 172 according to some embodiments. FIG. 24 depicts the dimensions of a heat sink 174 with a cup 176 according to some embodiments. FIGS. 22-23 depict the top and bottom dimensions of heat sinks 172, 174. The dimensions of a heat sink can similarly depend on a number of relevant factors, including: the one or more anticipated electronic and/or optoelectronic devices to be mounted on the mounting surface of the heat sink, the dimensions of the casing, the expected implementation of the SMD, the amount of heat expected to be dissipated by the heat sink, the material of the heat sink, and/or other relevant factors.

For example, in some embodiments and as shown in FIGS. 21-24, the dimensions of the heat sink 172 or 174 can be as follows: the width or diameter 178 of the extended plate 180 can be approximately 6.6 mm +/−0.5 mm, the height 182 can be about 2.6 mm +/−0.3 mm, the diameter of the pedestal section 184 proximate to the base 188 of the pedestal 186 can be about 3.05 mm +/−0.3 mm, the diameter of the pedestal section 190 extending above the recessed mount surface can be about 2.65+/−0.3 mm, the width or diameter of the recessed mounting surface 192 (shown in FIG. 24) can be about 2.1 mm 0.3 mm, the height of the pedestal section 194 can be approximately 1.55 mm +/−0.3 mm with a depth of the recess 196 (shown in FIG. 24) being about 0.30 mm +/−0.1 mm, and the width or diameter of the bores 198 can be about 0.8 mm +/−0.2 mm.

Figure 25:
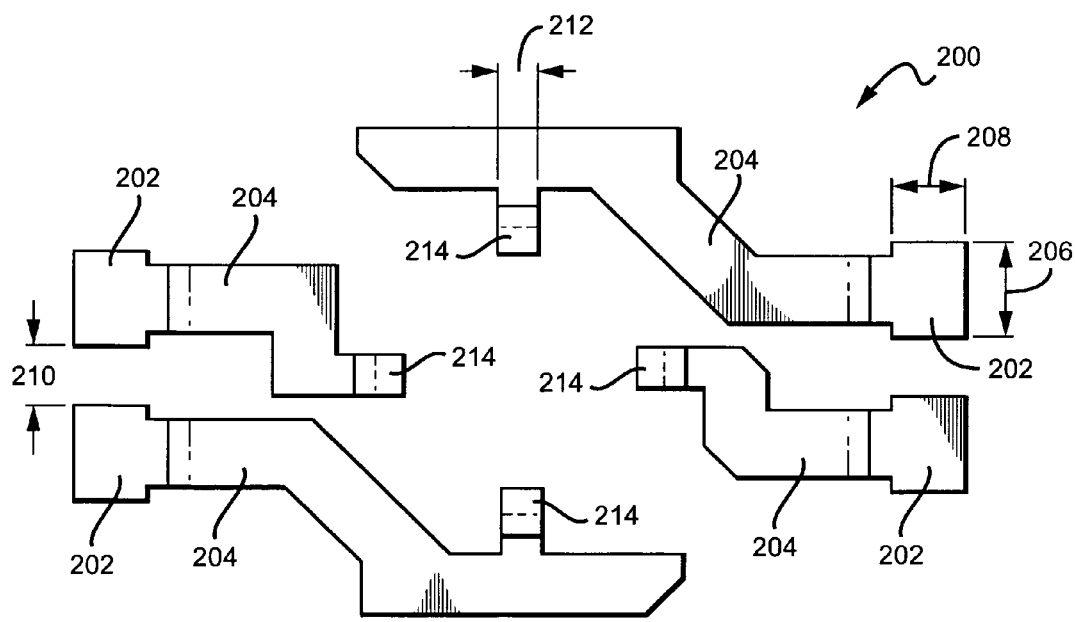
FIG. 25 is a top dimensional view of one embodiment of a lead assembly according to the present invention.
Figure 26:
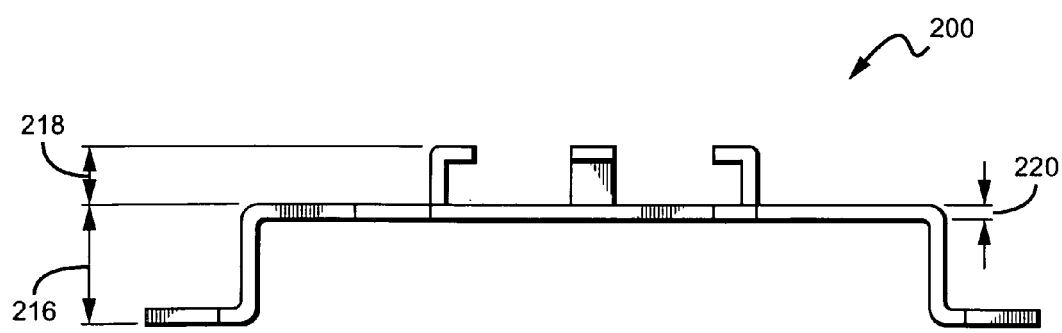
FIG. 26 is a side dimensional view of the embodiment shown in FIG. 25.

FIGS. 25-26 depict the dimensions of a lead assembly 200 according to some embodiments. The dimensions of a lead assembly can vary depending on implementation, the configuration of the contact areas and/or coupling areas, and/or other relevant factors. For example, in some embodiments of a lead assembly and as shown in FIGS. 25-26, the dimensions are as follows: the surface mount areas 202 of the leads 204 can have a first width 206 of about 1.3 mm +/−0.15 mm, a length 208 of about 1.0 mm +/−0.15 mm, the surface mount areas 202 can be separated by a distance 210 of about 0.9 mm +/−0.15 mm, the width 212 of the device coupling areas 214 can be about 0.6 mm +/−0.15 mm, the first height 216 can be about 1.7 mm +/−0.15 mm, the second height 218 can be about 0.8 mm +/−0.15 mm, and the leads 204 can have a thickness 220 of approximately 0.2 mm +/−0.05 mm.

Although the present invention has been described in considerable detail with reference to certain preferred configurations thereof, other versions are possible. The SMD, heat sink, and/or lead assembly can be used in many different devices. The SMD, heat sink, and lead assembly can also have many different shapes and can be interconnected with one another in many different ways. Accordingly, the spirit and scope of the invention should not be limited to the preferred versions of the invention described above.

We claim:

1. A surface mount device comprising:
a casing comprising a first surface, a second surface opposite said first surface, and at least one side surface;
a recess formed in said first surface and extending at least partially into said casing;
a plurality of leads at least partially encased by said casing, wherein each of said leads comprises a surface mount area at a first end, a device coupling area at a respective opposite end, and an extended lead portion extending between said surface mount area and said device coupling area, wherein said extended lead portion comprises a width less than the width of said surface mount area, wherein at least one of said extended lead portions extends along said at least one side surface, wherein said leads are angled to align said device coupling areas along first and second perpendicular axes, and wherein said device coupling areas are narrower than the widths of said extended lead portions, said device coupling areas straddling said first and second perpendicular axes;
one or more electronic or optoelectronic devices coupled with at least one of said device coupling areas, said one or more electronic or optoelectronic devices exposed through said recess; and
a heat sink comprising a raised portion and an extended plate and a laterally and circumferentially extending shelf, wherein said raised portion protrudes from said extended plate, wherein said shelf comprises first and second opposing lateral surfaces and a tapered circumferential perimeter connecting the first and second opposing lateral surfaces and tapered toward a central axis of said heat sink, wherein said casing comprises a material that is partially below said extended plate and adjacent to said shelf, wherein at least a portion of each of said leads is in thermal contact with said raised portion, extends up the length and to the top of said raised portion, and is shaped to match the contours of and at least partially frame at least said raised portion, said one or more electronic or optoelectronic devices on a mounting surface of said heat sink, wherein said device coupling areas are proximate to said raised portion of said heat sink.

2. The surface mount device of claim 1, further comprising a lens positioned relative to and protruding from said first surface.

3. The surface mount device of claim 1, wherein at least one of said plurality of leads extends through at least one of said side surfaces, and at least one of another of said plurality of leads extends through at least one of another of said side surfaces.

4. The surface mount device of claim 1, wherein at least a portion of each of said leads is exposed outside of said casing and/or within said recess.

5. The surface mount device of claim 1, wherein said heat sink is positioned proximate to at least a portion of at least one of said plurality of leads.

6. The surface mount device of claim 1, wherein said heat sink further comprises said extended plate and a base below said extended plate and said raised portion.

7. The surface mount device of claim 6, wherein the diameter of said extended plate is greater than the diameter of said base.

8. The surface mount device of claim 6, wherein said base comprises said laterally and circumferentially extending shelf.

9. The surface mount device of claim 6, wherein the diameter at the base of said raised portion is greater than the diameter at the top of said raised portion.

10. The surface mount device of claim 1, wherein said heat sink comprises the mounting surface coupled with said one or more electronic or optoelectronic devices.

11. The surface mount device of claim 1, wherein said heat sink comprises at least one through-hole.

12. The surface mount device of claim 11, wherein said casing extends through at least one through-hole.

13. The surface mount device of claim 1, wherein said mounting surface of said heat sink comprises a recessed mounting surface.

14. The surface mount device of claim 1, wherein said plurality of leads extends from the recess through the casing and exits the casing.

15. A surface mount device comprising:
a casing comprising a first surface, a recess formed in said first surface and extending at least partially into said casing, and at least one side surface;
a plurality of leads at least partially encased by said casing and extending from the recess through the casing and exiting the casing, wherein each of said leads comprises a surface mount area, a device coupling area, and an extended lead portion extending therebetween, wherein said extended lead portion comprises a width less than the width of said surface mount area, wherein at least one of said extended lead portions extends along said at least one side surface, wherein said leads are angled to align said device coupling areas along first and second perpendicular axes and wherein said device coupling areas are narrower than the widths of said extended lead portions, said device coupling areas straddling said first and second perpendicular axes;
at least one electronic device coupled with at least one of said device coupling areas and at least partially exposed through the recess; and
a heat sink proximate said plurality of leads and secured in said recess, said heat sink comprising a raised portion at least partially framed by portions of said leads in thermal contact with said raised portion and extending up the length and to the top of said raised portion, said heat sink comprising an extended plate and a laterally and circumferentially extending shelf, wherein said raised portion protrudes from said extended plate, wherein said shelf comprises first and second opposing lateral surfaces and a tapered circumferential perimeter connecting the first and second opposing lateral surfaces and tapered toward a central axis of said heat sink, wherein said casing comprises a material that is partially below said extended plate and adjacent to said shelf, said at least one electronic device on a mounting surface of said heat sink, wherein said device coupling areas are proximate to said raised portion of said heat sink.

16. The surface mount device of claim 15, further comprising a lens positioned relative to and protruding from said first surface.

17. The surface mount device of claim 15, wherein said heat sink further comprises:
an extended plate and a base below said extended plate;
the mounting surface coupled with the at least one electronic device; and
at least one through-hole.

18. The surface mount device of claim 17, wherein said heat sink is coupled with at least one of said plurality of leads.

19. The surface mount device of claim 17, wherein said casing extends through at least one through-hole.

20. The surface mount device of claim 15, wherein said mounting surface of said heat sink comprises a recessed mounting surface.

21. A surface mount device comprising:
a casing comprising a first surface, a second surface opposite said first surface, and at least one side surface;
a recess formed in said first surface and extending at least partially into said casing;
a lens positioned relative to and protruding from said first surface;
a plurality of leads at least partially encased by said casing and extending from the recess through the casing and exiting the casing, wherein each of said leads comprises a surface mount area, a device coupling area, and an extended lead portion extending between the surface mount and device coupling areas, wherein said extended lead portion comprises a width less than the width of said surface mount area, wherein at least one of said extended lead portions extends along said at least one side surface, wherein said leads are angled to align said device coupling areas along first and second perpendicular axes and wherein said device coupling areas are narrower than the widths of said extended lead portions, said device coupling areas straddling said first and second perpendicular axes; and
a heat sink secured in said recess of said casing, said heat sink comprising a raised portion at least partially framed by portions of said leads in thermal contact with said raised portion and extending up the length and to the top of said raised portion, said heat sink comprising an extended plate and a laterally and circumferentially extending shelf, wherein said raised portion protrudes from said extended plate, wherein said shelf comprises first and second opposing lateral surfaces and a tapered circumferential perimeter connecting the first and second opposing lateral surfaces and tapered toward a central axis of said heat sink, wherein said casing comprises a material that is partially below said extended plate and adjacent to said shelf, wherein said device coupling areas are proximate to said raised portion of said heat sink.

22. The surface mount device of claim 21, wherein one or more electronic and/or optoelectronic devices are coupled with at least one of said plurality of leads and are at least partially exposed through the recess.

23. The surface mount device of claim 21, wherein said heat sink comprises a recessed mounting surface.

24. The surface mount device of claim 21, wherein said heat sink comprises at least one through-hole.

25. The surface mount device of claim 24, wherein said casing extends through the at least one through-hole.

26. A method for use in manufacturing a surface mount device, the method comprising:
providing a casing with at least one side surface;
positioning a plurality of leads, wherein each of said leads comprises a surface mount area at a first end, a device coupling area at a respective opposite end, and an extended lead portion extending between said surface mount area and said device coupling area, wherein said extended lead portion comprises a width less than the width of said surface mount area, wherein at least one of said extended lead portions extends along said at least one side surface, wherein said leads are angled to align said device coupling areas along first and second perpendicular axes, and wherein said device coupling area are narrower than the widths of said extended lead portions, said device coupling areas straddling said first and second perpendicular axes;
positioning a heat sink proximate to at least a portion of said plurality of leads, said heat sink comprising a raised portion at least partially framed by portions of said leads in thermal contact with said raised portion and extending up the length and to the top of said raised portion, said heat sink comprising an extended plate and a laterally and circumferentially extending shelf, wherein said raised portion protrudes from said extended plate, wherein said shelf comprises first and second opposing lateral surfaces and a tapered circumferential perimeter connecting the first and second opposing lateral surfaces and tapered toward a central axis of said heat sink, wherein said casing comprises a material that is partially below said extended plate and adjacent to said shelf, wherein said device coupling areas are proximate to said raised portion of said heat sink;
securing said plurality of leads and heat sink with said casing such that the heat sink is maintained at a predefined position relative to said leads; and
mounting an electronic device on a mounting surface of said heat sink such that at least a portion of said electronic device is exposed through a recess in said casing.

27. The method of claim 26, wherein securing said plurality of leads and heat sink with the casing comprises:

securing the plurality of leads with the casing such that at least a portion of at least one of the plurality of leads is exposed through said recess and at least a portion of at least one of the plurality of leads is exposed outside said casing; and securing the heat sink with the casing such that at least a portion of a contact surface and at least a portion of the mounting surface of the heat sink are exposed through said casing.

28. The method of claim 26, wherein a lens is formed about said recess effectively covering said exposed portion of the mounted device.

29. The method of claim 26, wherein said mounting surface of said heat sink comprises a recessed mounting surface.

30. The method of claim 26, wherein said heat sink comprises at least one through-hole.

31. The method of claim 30, wherein said casing extends through the at least one through-hole.

32. The method of claim 26, wherein said plurality of leads extends from the recess through the casing and exiting the casing.

33. A surface mount device comprising:
a casing comprising a first surface and a recess formed in said first surface and extending at least partially into said casing;
a plurality of leads at least partially encased by said casing and extending from the recess through the casing and exiting the casing;
at least one electronic device coupled with at least one of the plurality of leads and at least partially exposed through the recess; and
a heat sink proximate said plurality of leads and secured in said recess, said heat sink comprising an extended plate and a laterally and circumferentially extending shelf, wherein said shelf comprises first and second opposing lateral surfaces and a tapered circumferential perimeter connecting the first and second opposing lateral surfaces and tapered toward a central axis of said jheat sink, wherein said extended plate is positioned between said extending shelf and a pedestal section of said heat sink.

34. The surface mount device of claim 33, further comprising a lens positioned relative to and protruding from said first surface.

35. The surface mount device of claim 33, wherein said at least one electronic device comprises one or more light emitting diodes (LEDs).

36. The surface mount device of claim 33, wherein said heat sink comprises at least one through-hole, and wherein said casing extends through said at least one through-hole.

* * * * *